US012808909B2

(12) United States Patent
Martin et al.

(10) Patent No.: US 12,808,909 B2

(45) Date of Patent: Nov. 24, 2026

(54) SYSTEM AND METHOD FOR MEASURING POWER QUALITY AT AN EDGE STRUCTURE

(71) Applicant: Tantalus Systems Corp., Burnaby (CA)

(72) Inventors: Keith Richard Martin, Burnaby (CA); Tereus Danien Scott, Victoria (CA); Galen Ulrich Elfert, Nelson (CA); Radu Ungureanu, Coquitlam (CA); Peter Randolph Aeberhardt, Maple Ridge (CA); Mark Fairburn, North Vancouver (CA)

(73) Assignee: Tantalus Systems Corp., Burnaby (CA)

( * ) Notice: Subject to any disclaimer, the term of this patent is extended or adjusted under 35 U.S.C. 154(b) by 160 days.

(21) Appl. No.: 18/625,727

(22) Filed: Apr. 3, 2024

(65) Prior Publication Data

US 2024/0361366 A1 Oct. 31, 2024

Related U.S. Application Data

(60) Provisional application No. 63/493,779, filed on Apr. 3, 2023.

(51) Int. Cl.

*G01R 22/06* (2006.01)
*H02J 3/38* (2026.01)
(Continued)

(52) U.S. Cl.

CPC ......... *G01R 22/063* (2013.01); *G01R 22/065* (2013.01); *G01R 22/066* (2013.01);
(Continued)

(58) Field of Classification Search

CPC ...... G01R 22/00; G01R 22/06; G01R 22/061; G01R 22/063; G01R 22/065;
(Continued)

(56) References Cited

U.S. PATENT DOCUMENTS

| | | | |
|---|---|---|---|
| 2,592,299 | A | 4/1952 | Lewis |
| 3,029,322 | A | 4/1962 | Waldrop |

(Continued)

FOREIGN PATENT DOCUMENTS

| | | | | |
|---|---|---|---|---|
| CN | 205246122 U | | 5/2016 | |
| CN | 205864077 U | * | 1/2017 | ............. H02J 13/00 |

(Continued)

OTHER PUBLICATIONS

PCT International Search Report and Written Opinion for International Application No. PCT/CA2024/050433, Jun. 25, 2024, 10 pages.

(Continued)

*Primary Examiner* — Hoai-An D. Nguyen

(74) *Attorney, Agent, or Firm* — Meister Seelig & Schuster PLLC

(57) ABSTRACT

A system for measuring power quality on an electrical grid is disclosed which includes monitoring systems installed at structures at the edge of the electrical grid receiving power via the electrical grid. Each monitoring system is electrically coupled to a panel assembly and electric service meter at the structure and includes a measurement unit configured to measure electrical values associated with the panel assembly at the structure and to detect power quality events based on the measured electrical values. The system further includes a reporting system configured to receive data representing the detected power quality events from the monitoring systems, detect patterns of disruption within the electrical grid through pattern matching of detected power quality (Continued)

events, and analyze power quality events to identify a probability of a complex event and to report this data to a user.

20 Claims, 24 Drawing Sheets

(51) Int. Cl.

| | |
|---|---|
| ***H02J 13/10*** | (2026.01) |
| ***H02J 13/12*** | (2026.01) |
| ***H02J 13/13*** | (2026.01) |
| *H02J 101/24* | (2026.01) |
| *H02J 105/42* | (2026.01) |

(52) U.S. Cl.
CPC ................ *H02J 3/38* (2013.01); *H02J 13/10* (2026.01); *H02J 13/12* (2026.01); *H02J 13/13* (2026.01); *H02J 2101/24* (2026.01); *H02J 2105/42* (2026.01)

(58) Field of Classification Search
CPC ... G01R 22/066; H02J 3/00; H02J 3/38; H02J 13/00; H02J 13/10; H02J 13/12; H02J 13/13; H02J 2101/00; H02J 2101/20; H02J 2101/22; H02J 2101/24; H02J 2105/00; H02J 2105/40; H02J 2105/42
USPC ............................................. 324/76.11, 114
See application file for complete search history.

(56) References Cited

U.S. PATENT DOCUMENTS

| | | | | |
|---|---|---|---|---|
| 3,131,984 | A | 5/1964 | Kobryner | |
| 3,353,142 | A | 11/1967 | Spencer | |
| 3,731,253 | A | 5/1973 | Coffey | |
| 4,494,163 | A | 1/1985 | Yelland | |
| 4,892,485 | A | 1/1990 | Patton | |
| 5,334,057 | A | 8/1994 | Blackwell | |
| 5,595,506 | A | 1/1997 | Robinson | |
| 5,630,273 | A | 5/1997 | Kobayashi | |
| 5,637,017 | A | 6/1997 | Hsu | |
| 5,834,932 | A | 11/1998 | May | |
| 5,898,387 | A | 4/1999 | Davis | |
| 5,997,347 | A | 12/1999 | Robinson | |
| 6,152,764 | A | 11/2000 | Robinson | |
| 6,188,145 | B1 | 2/2001 | Stewart | |
| 6,520,225 | B1 | 2/2003 | Dembicks | |
| 6,945,813 | B1 | 9/2005 | Kellerman | |
| 7,153,157 | B2 | 12/2006 | Robinson | |
| 7,199,572 | B1 | 4/2007 | May | |
| 7,274,305 | B1 | 9/2007 | Luttrell | |
| 7,335,033 | B1 | 2/2008 | Edwards, Jr. | |
| 7,415,370 | B2 | 8/2008 | Nisenblat | |
| 7,503,800 | B2 | 3/2009 | Siglock | |
| 7,511,468 | B2 | 3/2009 | McEachern | |
| 7,559,793 | B1 | 7/2009 | Zhang | |
| 7,648,389 | B1 | 1/2010 | Scott | |
| 7,729,810 | B2 | 6/2010 | Bell | |
| 8,054,591 | B2 | 11/2011 | Changali | |
| 8,103,563 | B2 | 1/2012 | O'Neil | |
| 8,140,414 | B2 | 3/2012 | O'Neil | |
| 8,159,793 | B2 | 4/2012 | Hall | |
| 8,177,580 | B2 | 5/2012 | Feldman | |
| 8,204,633 | B2 | 6/2012 | Harbin, III | |
| 8,407,115 | B2 | 3/2013 | O'Neil | |
| 8,547,686 | B2 | 10/2013 | Pruehs | |
| 8,602,814 | B2 | 12/2013 | Packard, III | |
| 8,768,526 | B2 | 7/2014 | Harbin, III | |
| 8,784,130 | B2 | 7/2014 | Scott | |
| 8,805,628 | B2 | 8/2014 | Patel | |
| 8,907,657 | B2 * | 12/2014 | Kagan | G01R 22/063 702/62 |
| 9,151,782 | B2 | 10/2015 | Lint | |
| 9,152,160 | B2 | 10/2015 | Harbin, III | |
| 9,318,861 | B2 | 4/2016 | Fulton | |
| 9,437,986 | B2 | 9/2016 | Knauer | |
| 9,500,672 | B1 | 11/2016 | Bautista | |
| 9,581,618 | B1 | 2/2017 | McEachern | |
| 9,595,815 | B2 | 3/2017 | Knauer | |
| 9,627,861 | B2 | 4/2017 | Cruz | |
| 9,702,959 | B2 | 7/2017 | Marshall | |
| 9,735,527 | B2 | 8/2017 | Bautista | |
| 9,785,167 | B2 | 10/2017 | Bell | |
| 9,825,463 | B2 | 11/2017 | McDaniel | |
| 10,015,184 | B1 | 7/2018 | Bell | |
| 10,089,641 | B2 | 10/2018 | Parks | |
| 10,110,976 | B2 | 10/2018 | Bell | |
| 10,153,635 | B2 | 12/2018 | O'Brien | |
| 10,168,073 | B2 | 1/2019 | Harbin, III | |
| 10,431,986 | B2 | 10/2019 | Fulton | |
| 10,641,806 | B2 | 5/2020 | Marshall | |
| 10,680,455 | B2 | 6/2020 | Hooshmand | |
| 10,830,802 | B2 | 11/2020 | Fulton | |
| 11,049,078 | B1 | 6/2021 | Jordan, II | |
| 11,099,537 | B2 | 8/2021 | Spalt | |
| 11,415,598 | B2 * | 8/2022 | Karlgaard | H01R 9/2433 |
| 2003/0092312 | A1 | 5/2003 | Johnson | |
| 2007/0247767 | A1 | 10/2007 | Zhang | |
| 2007/0279166 | A1 | 12/2007 | VanderVeen | |
| 2008/0008151 | A1 | 1/2008 | Li | |
| 2010/0017045 | A1 | 1/2010 | Nesler | |
| 2010/0323555 | A1 | 12/2010 | Geiger | |
| 2011/0021186 | A1 | 1/2011 | Fischer | |
| 2011/0082598 | A1 | 4/2011 | Boretto | |
| 2011/0295575 | A1 | 12/2011 | Levine | |
| 2012/0316692 | A1 | 12/2012 | Bell | |
| 2012/0330583 | A1 | 12/2012 | Serra | |
| 2014/0039712 | A1 | 2/2014 | Bell | |
| 2014/0043170 | A1 | 2/2014 | Bell | |
| 2014/0043171 | A1 | 2/2014 | Bell | |
| 2014/0067291 | A1 | 3/2014 | Balog | |
| 2014/0107858 | A1 | 4/2014 | Bell | |
| 2014/0184134 | A1 | 7/2014 | Bell | |
| 2014/0188301 | A1 | 7/2014 | Bell | |
| 2014/0218010 | A1 | 8/2014 | Fulton | |
| 2015/0194812 | A1 | 7/2015 | Bell | |
| 2015/0288175 | A1 | 10/2015 | May | |
| 2016/0131686 | A1 | 5/2016 | Handley | |
| 2016/0179994 | A1 | 6/2016 | Levine | |
| 2016/0223602 | A1 | 8/2016 | Carlson | |
| 2016/0359311 | A1 | 12/2016 | Handy | |
| 2018/0100912 | A1 | 4/2018 | Bell | |
| 2018/0321350 | A1 | 11/2018 | Marshall | |
| 2019/0257886 | A1 | 8/2019 | Hooshmand | |
| 2020/0153208 | A1 | 5/2020 | Miller | |
| 2020/0333767 | A1 | 10/2020 | Engelstein | |
| 2021/0373518 | A1 | 12/2021 | Spalt | |
| 2022/0244076 | A1 | 8/2022 | Karlgaard | |

FOREIGN PATENT DOCUMENTS

| | | | |
|---|---|---|---|
| DE | 10036700 | A1 | 2/2002 |
| EP | 2505257 | A1 | 10/2012 |
| WO | 1994019899 | A1 | 9/1994 |
| WO | 2009099515 | A1 | 8/2009 |
| WO | 2013123441 | A1 | 8/2013 |
| WO | 2016130482 | A1 | 8/2016 |

OTHER PUBLICATIONS

"Using Synchrophasor Data to Determine Disturbance Location," North American Synchrophasor Initiative (NASPI), Feb. 2019 (51 pages).
"Why Are Phasors Used in AC Analysis?," Quora, question page containing 4 answers, available at https://www.quora.com/Why-are-phasors-used-in-AC-analysis, updated Nov. 12, 2021 (16 pages).
AI on the Grid, An NI4AI Workshop, Oct. 21, 2020 (80 pages).
Al-Hammouri, A. T., et al., "Virtualization of Synchronized Phasor Measurement Units Within Real-Time Simulators for Smart Grid Applications," 2012 IEEE Power and Energy Society General

(56) References Cited

OTHER PUBLICATIONS

Meeting, San Diego, CA, USA, 2012, pp. 1-8, doi: 10.1109/PESGM.2012.6344949.
Allnutt et al., Timing Challenges in the Smart Grid, NIST SP 1500-08, National Institute of Standards and Technology, 2017, doi: 10.6028/NIST.SP.1500-08 (29 pages).
Arghandeh et al., Synchronized Measurements and Their Applications in Distribution Systems: An Update, NASPI-2020-TR-016, North American SynchroPhasor Initiative, Jun. 2020 (40 pages).
Arghandeh, R. "Micro-Synchrophasors for Power Distribution Systems," Engineering & Technology Reference, IET, 2016. doi: 10.1049/etr.2015.0079 (18 pages).
Arghira, N., et al., "Modern SCADA Philosophy in Power System Operation—A Survey," U.P.B. Scientific Bulletin, Series C: Electrical Engineering, vol. 73, No. 2, pp. 153-166, 2011.
Bariya, Mohini, "Applications of Time Synchronized Measurements in the Electric Grid," Electrical Engineering and Computer Sciences, University of California, Berkeley, Technical Report No. UCB/EECS-2021-196, http://www2.eecs.berkeley.edu/Pubs/TechRpts/2021/EECS-2021-196.html, Aug. 13, 2021 (201 pages).
Bastos, A. F., et al., "Accurate Identification of Point-on-Wave Inception and Recovery Instants of Voltage Sags and Swells," in IEEE Transactions on Power Delivery, vol. 34, No. 2, pp. 551-560, Apr. 2019 (10 pages).
BC Hydro, Distributed Generation Interconnection Requirements—100 KW and Below (DGTIR-100), Revision 1, Oct. 17, 2014, available at https://app.bchydro.com/content/dam/BCHydro/customer-portal/documents/distribution/standards/ds-dgi-100kw-and-below-requirements.pdf (32 pages).
BC Hydro, Net Metering Informational Webinar, Feb. 16, 2021 (28 pages).
Berrisford, A. J., "Smart Meters Should be Smarter," 2012 IEEE Power and Energy Society General Meeting, San Diego, CA, USA, 2012, pp. 1-6, doi: 10.1109/PESGM.2012.6345146.
Blair, S. M., et al., "Validating Secure and Reliable IP/MPLS Communications for Current Differential Protection," 13th International Conference on Developments in Power System Protection (DPSP 2016), 2016, pp. 1-6. doi: 10.1049/cp.2016.0070.
Bohme, Dr. Klaus, et al., "Point on Wave Switching / Controlled Switching," presented at the OMICRON electronics GmbH User Meeting 2019, OMICRON electronics GmbH, 2019, available from OMICRON electronics GmbH technical publications (6 pages).
Brown, B., "Section 11: Power Quality Considerations," Square D Engineering Services, Schneider Electric, 2006 (6 pages).
Caliskan, S. Y. and Tabuada, P., "Towards Kron Reduction of Generalized Electrical Networks," Automatica, vol. 50, No. 10, pp. 2586-2590, Oct. 2014, ISSN 0005-1098, doi: 10.1016/j.automatica.2014.08.017.
Carroll, J. Ritchie and Robertson, F. Russell, A Comparison of Phasor Communication Protocols: A Comparison of IEEE C37.118.2-2011, IEC TR 61850-90-5 and the Streaming Telemetry Transport Protocol (STTP) for the Transfer of Synchrophasor and Other Streaming Data, Pacific Northwest National Laboratory, Richland, WA, PNNL-28499, Feb. 2019, doi: 10.2172/1504742 (86 pages).
Chen, D. and Irwin, D., "SunDance: Black-box Behind-the-Meter Solar Disaggregation," e-Energy '17: Proceedings of the Eighth International Conference on Future Energy Systems, ACM, 2017, pp. 45-55. doi: 10.1145/3077839.3077848.
Chen, Y. C., Banerjee, T., Domínguez-García, A. D., and Veeravalli, V. V., "Quickest Line Outage Detection and Identification," IEEE Transactions on Power Systems, vol. 31, No. 1, pp. 749-758, Jan. 2016, doi: 10.1109/TPWRS.2015.2394246.
Crnko, Tim, "Selective Coordination Enforcement: Overcurrent Protective Device Basics," IAEI News, Jul./Aug. 2010, reprinted by Eaton (Cooper Bussmann), available at https://www.eaton.com/content/dam/eaton/products/electrical-circuit-protection/fuses/selective-coordination-ii/bus-ele-selective-coordination-enforcement-overcurrent-protective-device-basics.pdf (10 pages).
Dall'Anese, E., Guggilam, S. S., Simonetto, A., Chen, Y. C., and Dhople, S. V., "Optimal Regulation of Virtual Power Plants," IEEE Transactions on Power Systems, vol. 33, No. 2, pp. 1868-1881, Mar. 2018, doi: 10.1109/TPWRS.2017.2741920.
Das, H. P. and Pradhan, A. K., "Development of a Micro-Phasor Measurement Unit for Distribution System Applications," 2016 National Power Systems Conference (NPSC), Bhubaneswar, India, 2016, pp. 1-5, doi: 10.1109/NPSC2016.7858913.
DATAQ Instruments, FFT (Fast Fourier Transform) Waveform Analysis, DATAQ Instruments, Inc., General Education Tutorial, available at https://www.dataq.com/data-acquisition/general-education-tutorials/fft-fast-fourier-transform-waveform-analysis.html (accessed Jul. 21, 2026).
Denholm, Paul, et al., Inertia and the Power Grid: A Guide Without the Spin, National Renewable Energy Laboratory (NREL), Technical Report No. NREL/TP-6A20-73856, May 2020 (48 pages).
Dusabimana, Emile, and Sung-Guk Yoon, "A Survey on the Micro-Phasor Measurement Unit in Distribution Networks," Electronics, vol. 9, No. 2, Article 305, Feb. 2020. DOI: 10.3390/electronics9020305 (16 pages).
Dutta, S., et al., "Role of Microphasor Measurement Unit for Decision Making Based on Enhanced Situational Awareness of a Modern Distribution System," in Decision Making Applications in Modern Power Systems, Academic Press, 2020, pp. 181-199. doi: 10.1016/B978-0-12-816445-7.00007-4.
Eaton Corporation, Next Generation Power Quality Meters, Publication No. PU02601001E, Eaton Corporation, Power Xpert™ 4000/6000/8000 Series, Jan. 2006 (12 pages).
Eaton Corporation, Power Xpert Architecture, Publication No. BR02601012E/Z8962, Sep. 2009 (14 pages).
Eaton, Fuseology: Overcurrent Protection Fundamentals, Eaton Corporation, Bussmann Series, 2017 (52 pages).
Elspec Ltd. PQDIF Viewer (PQSCADA Sapphire). Elspec Ltd., product webpage, available at: https://www.elspec-ltd.com/power-quality-software-pqscada-software/pqdif-viewer/, accessed Jul. 21, 2026.
Elspec Ltd., G4500 Portable Power Quality Analyzer, available at: https://www.elspec-ltd.com/metering-protection/power-quality-analyzers/g4500-power-qaulity-analyzer-portable/ (archived at https://web.archive.org/web/20240118231955/https://www.elspec-ltd.com/metering-protection/power-quality-analyzers/g4500-power-qaulity-analyzer-portable/), archived Jan. 18, 2024 via Internet Archive (Wayback Machine).
Elspec Ltd., PureBB—Handheld Power Quality Analyzer, product webpage, available at: https://www.elspec-ltd.com/metering-protection/power-quality-analyzers/purebb-power-quality-analyzer-handheld/, accessed Jul. 21, 2026.
ENMAX Power Corporation, Metering Standard, Rev. 2, Apr. 15, 2019, ENMAX Power Corporation, Calgary, Alberta, Canada (54 pages).
Fitzpatrick, Gerald, "Technical Standards for Synchrophasor Measurements," North American SynchroPhasor Initiative (NASPI) Webinar/Presentation, National Institute of Standards and Technology (NIST), Mar. 22, 2016, available at https://www.naspi.org/sites/default/files/2026-06/nist_fitzpatrick_technical_standards_20160322.pdf (24 pages).
Flerchinger et al., "All the Data Fit to Print—Applying All the Available Synchrophasor Information," 13th Annual Western Power Delivery Automation Conference, Mar. 2011 (9 pages).
Follum, Jim, et al., Phasors or Waveforms: Considerations for Choosing Measurements to Match Your Application, PNNL-31215, Pacific Northwest National Laboratory, Apr. 2021, 43 pages.
FS Community, "Basic Knowledge About GPON SFP Transceivers," FS Community Blog, Jan. 18, 2018, available at https://community.fs.com/blog/basic-knowledge-about-gpon-sfp-transceivers.html (5 pages).
Ghiga et al., "Phasor Measurement Unit under Interference Conditions," IEEE Transactions on Power Delivery, vol. 33, No. 2, pp. 630-639, 2018. doi: 10.1109/TPWRD.2017.2691356 (11 pages).
Gray, J., "What's New: IEC 61000-4-5 Second Edition vs. Third Edition," Interference Technology, EMC Directory & Design Guide, Apr. 28, 2016, available at https://interferencetechnology.com/whats-new-iec-61000-4-5-second-edition-vs-third-edition/.
Hadi, A. A., et al., Secure and Cost-Effective Micro Phasor Measurement Unit (PMU)-Like Metering for Behind-the-Meter (BTM)

(56) References Cited

OTHER PUBLICATIONS

Solar Systems Using Blockchain-Assisted Smart Inverters: Preprint, NREL/CP-5D00-75447, National Renewable Energy Laboratory, Mar. 2020 (10 pages).
Haider, R. and Kim, C.-H., "Protection of DERs," in Integration of Distributed Energy Resources in Power Systems, Academic Press, 2016, pp. 157-192. doi: 10.1016/B978-0-12-803212-1.00007-6.
Hataway, Greg, "Synchrophasors for Distribution Applications," Presented at the Power and Energy Automation Conference, Spokane, Washington, Mar. 26-28, 2013 (7 pages).
Hitachi ABB Power Grids, 20210127 Hitachi ABB Merging Unit, Hitachi ABB Power Grids Ltd., Jan. 27, 2021 (29 pages).
Huang et al., "Data Quality Issues for Synchrophasor Applications Part II: Problem Formulation and Potential Solutions," Journal of Modern Power Systems and Clean Energy, vol. 4, No. 3, pp. 353-361, Jul. 2016. doi: 10.1007/s40565-016-0213-8.
IEC/IEEE 60255-118-1:2018, Measuring relays and protection equipment—Part 118-1: Synchrophasor for power systems—Measurements, Edition 1.0, Dec. 2018 (78 pages).
IEEE Power Engineering Society, IEEE Standard for Synchrophasor Measurements for Power Systems, IEEE Std C37.118.1-2011, IEEE, Dec. 28, 2011, pp. 1-61, ISBN 978-0-7381-6811-1.
IEEE/IEC, IEEE/IEC International Standard—Measuring Relays and Protection Equipment—Part 118-1: Synchrophasor for Power Systems—Measurements, IEC/IEEE 60255-118-1:2018, IEEE, Dec. 19, 2018, pp. 1-78, doi: 10.1109/IEEESTD.2018.8577045.
Institute of Electrical and Electronics Engineers (IEEE), IEEE Recommended Practice for Power Quality Data Interchange Format (PQDIF), IEEE Std 1159.3-2019, ISBN 978-1-5044-5562-6, published May 1, 2019 (185 pages).
Ishikawa, S., Synchrophasor Visual Integration and Event Evaluation for Utilities (SynchroVIEEU) with High Penetration of Renewables, Final Scientific/Technical Report, Hawaiian Electric Companies, DOE Award No. De-OE0000705, Jan. 15, 2019 (31 pages).
Jain, A. and Bhullar, S., "Micro-Phasor Measurement Units (μPMUs) and Its Applications in Smart Distribution Systems," ISGW 2017: Compendium of Technical Papers, Lecture Notes in Electrical Engineering, vol. 487, Springer, 2018, pp. 81-92. doi: 10.1007/978-981-10-8249-8_7.
Jones et al., Time Synchronization in the Electric Power System, NASPI Technical Report, NASPI-2017-TR-001, PNNL-26331, Mar. 2017.
Jones, Jonathan Spencer, "A Year In Blockchain—What's Coming For The Energy Sector In 2022," Dec 30, 2021 (4 pages).
Kirkham et al., "Error Correction: A Proposal for a Standard," 2016 Conference on Precision Electromagnetic Measurements (CPEM 2016), 2016. doi: 10.1109/CPEM.2016.7540557 (2 pages).
Kirkham et al., "Measurement, Nyquist and Shannon: A View of PMU Metrology," 2017 10th International Symposium on Advanced Topics in Electrical Engineering (ATEE), 2017, pp. 23-27. doi: 10.1109/ATEE.2017.7905142.
Kirkham, H. and Riepnieks, A., Measurement of Phasor-like Signals, Pacific Northwest National Laboratory (PNNL), PNNL-25643, prepared for the North American SynchroPhasor Initiative (NASPI), Jun. 2016 (134 pages).
Kirkham, H., "The Measurand: The Problem of Frequency," 2016 IEEE International Instrumentation and Measurement Technology Conference Proceedings (I2MTC), Taipei, Taiwan, 2016, pp. 1-5, doi: 10.1109/12MTC2016.7520347.
Kirkham, H., A Conceptual Framework for Measurement (with emphasis on phasor measurement), Pacific Northwest National Laboratory (PNNL), Report No. PNNL-24071, Feb. 2015, available at https://certs.lbl.gov/publications/conceptual-framework-measurement.html.
Kirkham, H., et al., "The Nature of Measurement, and the True Value of a Measured Quantity," IEEE 2018 (6 pages).
Kirkham, Harold, "75 Years of Drift: The Changing Meaning of Phasor [History]," IEEE Power and Energy Magazine, Jan./Feb. 2020, Doi: 10.1109/MPE.2019.2945102 (8 pages).
Kojovic et al., Practical Aspects of Rogowski Coil Applications to Relaying, IEEE Power Engineering Society, Power System Relaying Committee, Special Report, Sep. 2010 (72 pages).
Kumar, S., et al., Mr. Plotter: Unifying Data Reduction Techniques in Storage and Visualization Systems, UCB/EECS-2018-85, University of California, Berkeley, May 22, 2018 (16 pages).
Laverty et al., "The OpenPMU Platform for Open-Source Phasor Measurements," IEEE Transactions on Instrumentation and Measurement, vol. 62, No. 4, pp. 701-709, 2013. doi: 10.1109/TIM.2013.2240920.
Lee, L.-A., and Centeno, V., "Comparison of μPMU and PMU," Proc 2018 Clemson University Power Systems Conference (PSC), pp. 1-6, 2018. doi: 10.1109/PSC2018.8664037.
Lesavre et al., Blockchain Networks: Token Design and Management Overview, NISTIR 8301, National Institute of Standards and Technology, Feb. 2021. doi: 10.6028/NIST.IR.8301 (84 pages).
Liu et al., "Active Power Control of Solar PV Generation for Large Interconnection Frequency Regulation and Oscillation Damping," International Journal of Energy Research, vol. 40, pp. 353-361, 2016. doi: 10.1002/er.3362.
Liu et al., "D-PMU Based Applications for Emerging Active Distribution Systems: A Review," Electric Power Systems Research, vol. 179, Art. 106063, 2020. doi: 10.1016/j.epsr.2019.106063 (12 pages).
Liu et al., "Recent Developments of FNET/GridEye—A Situational Awareness Tool for Smart Grid," CSEE Journal of Power and Energy Systems, vol. 2, No. 3, pp. 19-27, Sep. 2016. doi: 10.17775/CSEEJPES.2016.00031.
Liu et al., "Wide-Area Measurement System Development at the Distribution Level: An FNET/GridEye Example," IEEE Transactions on Power Delivery, vol. 31, No. 2, pp. 721-731, Apr. 2016. doi: 10.1109/TPWRD.2015.2478811.
Lu et al., "A Microgrid Monitoring System Over Mobile Platforms," IEEE Transactions on Smart Grid, vol. 8, No. 2, pp. 749-758, 2017. doi: 10.1109/TSG.2015.2510974.
Martin, K. E., "Synchrophasor Standards Development—IEEE C37.118 & IEC 61850," Proc 44th Hawaii Int'l Conf on System Sciences (HICSS), pp. 1-8, 2011. doi: 10.1109/HICSS.2011.393.
McEachern, A., "Micro-Synchrophasors for Distribution Grids: Instrumentation Lessons Learned (So Far!)," Power Standards Lab, Mar. 23, 2016 (26 pages).
Mog, G. E. and Ribeiro, E. P., "Total Harmonic Distortion Calculation by Filtering for Power Quality Monitoring," Proceedings of the 2004 Transmission and Distribution Conference and Exposition: Latin America (T&D-LA 2004), Curitiba, Brazil, 2004 (4 pages).
Moxley, R., "Synchrophasors in the Real World," Proceedings of the 7th Annual Western Power Delivery Automation Conference, Spokane, WA, Schweitzer Engineering Laboratories, Inc., May 2005 (11 pages).
Mureddu et al., "Islanding the Power Grid on the Transmission Level: Less Connections for More Security," Scientific Reports, vol. 6, Art. No. 34797, 2016. doi: 10.1038/srep34797 (11 pages).
Murphy, Sean, "Accelerating Artificial Intelligence on the Grid," 2020 Clemson University Power Systems Conference (PSC), Clemson, SC, USA, 2020, DOI: 10.1109/PSC50246.2020.9131317 (7 pages).
National Electrical Manufacturers Association (NEMA), American National Standard for Requirements for Watthour Meter Sockets, ANSI C12.7-2014, approved Aug. 14, 2014 (9 pages).
North American SynchroPhasor Initiative (NASPI), NASPI Webinar Chat Questions, Mar. 18, 2020 (3 pages).
Orton, R., "A Call to Rethink Electricity Measurement," Pacific Northwest National Laboratory (PNNL), Feature Article, Aug. 3, 2021, available at https://www.pnnl.gov/news-media/call-rethink-electricity-measurement.
Patterson, John, "A Synchronized Self Contained Line Powered Continuous Point on Wave Recorder," Arizona State University, Apr. 13, 2021 (25 pages).
Poshala, Purnachandar, Why Oversample when Undersampling can do the Job?, Texas Instruments Application Report No. SLAA594A, High Speed Data Converters, Jun. 2013 (Revised Jul. 2013), Texas Instruments Incorporated (12 pages).
Poungsri et al., "The Design of Simulation and the Creation of a Combination Wave and Ring Wave Generator are in accordance

(56) References Cited

OTHER PUBLICATIONS with the International Standard IEC 61000-4-5 and IEC 61000-4-12," 2019 7th International Electrical Engineering Congress (IEECON), 2019, pp. 1-4. doi: 10.1109/IEECON45304.2019.8938935.
Power System Relaying And Control Committee Of The IEEE Power And Energy Society Minutes Of The Meeting (Rev. 1), Jan. 12-16, 2020, Jacksonville, FL (92 pages).
Rana et al., "Exploring IEEE Standard for Synchrophasor C37.118 with Practical Implementation," 2015 Annual IEEE India Conference (INDICON), 2015, pp. 1-6. doi: 10.1109/INDICON.2015.7443664.
Ratnam, E. L., Baldwin, K. G. H., Mancarella, P., Howden, M., and Seebeck, L., "Electricity System Resilience in a World of Increased Climate Change and Cybersecurity Risk," The Electricity Journal, vol. 33, No. 9, Article 106833, 2020, doi: 10.1016/j.tej.2020.106833.
Riepnieks, Artis, "Parameter Estimation And Signal Modelling For Phasor Measurement Units," Doctoral Thesis, Riga 2018 (91 pages).
Schweitzer, E. O., III and Kasztenny, B., "Distance Protection: Why Have We Started With a Circle, Does It Matter, and What Else Is Out There?," 71st Annual Conference for Protective Relay Engineers (CPRE 2018), 2018. doi: 10.1109/CPRE.2018.8349791 (21 pages).
Schweitzer, E. O., III and Whitehead, D. E., "Real-World Synchrophasor Solutions," presented at the 35th Annual Western Protective Relay Conference, Spokane, WA, Oct. 21-23, 2008, Schweitzer Engineering Laboratories, Inc. (13 pages).
Schweitzer, E. O., III, et al., "Advanced Real-Time Synchrophasor Applications," Proceedings of the 35th Annual Western Protective Relay Conference, Spokane, WA, Oct. 21-23, 2008, Schweitzer Engineering Laboratories, Inc. (14 pages).
Silverstein, Alison, et al., "Point on Wave Data What and Why," NASPI Work Group Meeting, Oct. 29, 2019 (11 pages).
Spencer Jones, J., "Staking Comes to Energy Sector Blockchains," Smart Energy International, Aug. 27, 2021 (3 pages).
Stewart, E., et al., "Open μPMU: A Real World Reference Distribution Micro-Phasor Measurement Unit Data Set for Research and Application Development," Lawrence Berkeley National Laboratory (LBNL), Technical Report LBNL-1006408, Berkeley, CA, Oct. 2016, available at https://eta-publications.lbl.gov/sites/default/files/lbnl-1006408_open_upmu_ieee_oct2016.pdf (5 pages).
Stewart, Emma M., "Phasor Measurements for Distribution System Applications," Smart Grid Handbook, Online (2016), DOI: 10.1002/9781118755471.sgd087 (11 pages).
Tantalus Systems Inc., "Tantalus Announces Next-Generation Fiber-Connected Metering Solution," Tantalus News, Mar. 18, 2021, available at https://www.tantalus.com/2021/03/18/tantalus-announces-next-generation-fiber-connected-metering-solution/.
Texas Instruments Inc., Active Integrator for Rogowski Coil Reference Design With Improved Accuracy for Relays and Breakers, TI Designs User Guide No. TIDUBY4A, Jul. 2020 (Rev. A), (47 pages).
The Smart Grid Interoperability Panel-Smart Grid Cybersecurity Committee, Guidelines for Smart Grid Cybersecurity, NISTIR 7628 Rev. 1, National Institute of Standards and Technology, Sep. 2014. doi: 10.6028/NIST.IR.7628r1 (668 pages).
Tung, L., "US Energy Department Tests New Smart Grid Chip from Nvidia, Utilidata," ZDNet, Jan. 6, 2022 (reporting on NVIDIA and Utilidata's software-defined smart grid chip development and testing by the U.S. Department of Energy's National Renewable Energy Laboratory), (4 pages).
Udren, E. A., "Synchrophasor Applications in Distribution," presented at the Electric Power Industry Conference (EPIC), University of Pittsburgh, Pittsburgh, PA, Oct. 15, 2018 (32 pages).
Usman, M. U. and Faruque, M. O., "Applications of Synchrophasor Technologies in Power Systems," Journal of Modern Power Systems and Clean Energy, vol. 7, No. 2, pp. 211-226, Mar. 2019, doi: 10.1007/s40565-018-0455-8.
USPTO Patent Public Search, Pre-Grant Publication Database Search Results: "in/mceachern and in/alexander," PGPUB Production Database, searched Mar. 15, 2001-Sep. 30, 2001.
Utilidata, Inc., Utilidata Develops Software-Defined Smart Grid Chip With NVIDIA, Press Release, Dec. 16, 2021, available at https://utilidata.com/press-release/utilidata-develops-software-defined-smart-grid-chip-with-nvidia.
Von Meier et al., "Synchrophasor Monitoring for Distribution Systems: Technical Foundations and Applications," NASPI-2018-TR-001, Naspi Distribution Task Team White Paper, Jan. 2018.
Von Meier, A., "Occupational Cultures as a Challenge to Technological Innovation," IEEE Transactions on Engineering Management, vol. 46, No. 1, Feb. 1999, pp. 101-114. doi: 10.1109/17.740041.
Von Meier, A., Culler, D. E., McEachern, A., and Arghandeh, R., "Micro-Synchrophasors for Distribution Systems," 2014 IEEE PES Innovative Smart Grid Technologies Conference (ISGT), 2014, pp. 1-5. doi: 10.1109/ISGT.2014.6816509.
Vosbrink, D., Continuous Rating of Meter Socket Jaws, Eaton Corporation, Publication No. WP307004EN, Electrical Sector, Eaton, 2017.
Wache and Murray, "Application of Synchrophasor Measurements for Distribution Networks," Proc 2011 IEEE Power & Energy Society General Meeting, pp. 1-4, 2011. doi: 10.1109/PES.2011.6039337.
Wang et al., "Adaptive Subband Compression for Streaming of Continuous Point-on-Wave and PMU Data," IEEE Transactions on Power Systems, vol. 36, No. 6, Nov. 2021, pp. 5612-5621. doi: 10.1109/TPWRS.2021.3072882.
Wang et al., "Highly Accurate Frequency Estimation for FNET," Proc 2013 IEEE Power & Energy Society General Meeting, pp. 1-5, 2013. doi: 10.1109/PESMG.2013.6672771.
Wang et al., "Micro-PMU for Distribution Power Lines," CIRED—Open Access Proceedings Journal, vol. 2017, No. 1, pp. 333-337, 2017. doi: 10.1049/oap-cired.2017.0137.
Williams, D., "Understanding THD (Total Harmonic Distortion) in Power Systems," All About Circuits, Mar. 15, 2017, available at https://www.allaboutcircuits.com/technical-articles/understanding-thd-total-harmonic-distortion-in-power-systems/.
Williams, David, "The Importance of Total Harmonic Distortion," All About Circuits, Mar. 15, 2017, available at https://www.allaboutcircuits.com/technical-articles/the-importance-of-total-harmonic-distortion/ (8 pages).
Yaga et al., Blockchain Technology Overview, NISTIR 8202, National Institute of Standards and Technology, Oct. 2018. doi: 10.6028/NIST.IR.8202 (68 pages).
Yao et al., "A Fast Load Control System Based on Mobile Distribution-Level Phasor Measurement Unit," IEEE Transactions on Smart Grid, vol. 11, No. 1, pp. 895-904, Jan. 2020. doi: 10.1109/TSG.2019.2926205.
Yao et al., "A Novel Method for Phasor Measurement Unit Sampling Time Error Compensation," IEEE Transactions on Smart Grid, vol. 9, No. 2, pp. 1065-1074, Mar. 2018. doi: 10.1109/TSG.2016.2574946.
Yao et al., "GPS Signal Loss in the Wide Area Monitoring System: Prevalence, Impact, and Solution," Electric Power Systems Research, vol. 147, pp. 254-262, 2017. doi: 10.1016/j.epsr.2017.03.004.
Yao et al., "Impact of GPS Signal Loss and Its Mitigation in Power System Synchronized Measurement Devices," IEEE Transactions on Smart Grid, vol. 9, No. 2, pp. 1141-1149, Mar. 2018. doi: 10.1109/TSG.2016.2580002.
Zhan and Liu, "Improved WLS-TF Algorithm for Dynamic Synchronized Angle and Frequency Estimation," Proc 2014 IEEE PES General Meeting | Conference & Exposition, pp. 1-5, 2014. doi: 10.1109/PESGM.2014.6938906.
Zhan et al., "A Clarke Transformation-Based DFT Phasor and Frequency Algorithm for Wide Frequency Range," IEEE Transactions on Smart Grid, vol. 9, No. 1, pp. 67-77, Jan. 2018. doi: 10.1109/TSG.2016.2544947.
Zhan et al., "Dynamic Single-Phase Synchronized Phase and Frequency Estimation at the Distribution Level," IEEE Transactions on Smart Grid, vol. 6, No. 4, pp. 2013-2022, Jul. 2015. doi: 10.1109/TSG.2015.2400973.

(56) References Cited

OTHER PUBLICATIONS

Zhan et al., "Improvement of Timing Reliability and Data Transfer Security of Synchrophasor Measurements," Proc 2014 IEEE PES T&D Conference and Exposition, pp. 1-5, 2014. doi: 10.1109/TDC2014.6863270.
Zhao et al., "Impact of Measurement Errors on Synchrophasor Applications," Proc 2017 IEEE Power & Energy Society General Meeting (PESGM), 2017. doi: 10.1109/PESGM.2017.8273743 (70 pages).
Zhao et al., "Impact of the Measurement Errors on Synchrophasor-Based WAMS Applications," IEEE Access, vol. 7, pp. 143960-143972, 2019. doi: 10.1109/ACCESS.2019.2945786.
Zhao et al., "Measurement Accuracy Limitation Analysis on Synchrophasors," Proc 2015 IEEE Power & Energy Society General Meeting (PESGM), pp. 1-5, 2015. doi: 10.1109/PESGM.2015.7285682.
Zheng et al., "A Synchrophasor System Emulator—Software Approach and Real-Time Simulations," Proc 2015 IEEE Power & Energy Society General Meeting (PESGM), pp. 1-5, 2015. doi: 10.1109/PESGM.2015.7286305.
Silverstein, Alison, et al., "High-Resolution, Time-Synchronized Grid Monitoring Devices," North American Synchrophasor Initiative, Technical Report, Mar. 20, 2020 (49 pages).
Hu, Dr. Yi, "Applying Synchrophasor Technology to Enhance Distribution System Operations," Utility University Course 205, DistribuTECH 2019, Feb. 5-7, 2019 (64 pages).
Ronald N. Bracewell, "The Fourier Transform," Scientific American, Jun. 1989, pp. 86-95.

* cited by examiner

| Parameter | Values | Description |
| --- | --- | --- |
| Measures | Volts, Amps, Frequency, Power Factor, Real Power, Apparent Power, Reactive Power, Real Power Hours, Apparent Power Hours, Reactive Power Hours, Resistance, Impedance, Total Harmonic Distortion(Amps) , Total Harmonic Distortion(Amps) | Type of measurement for the channel |
| Measure Reference | Line 1 to Neutral,<br>Line 2 to Neutral,<br>Line 1 + Line 2<br>Line 1 – Line 2 | Power measurement points of reference |
| Sample Element | 1-Cycle, 1-Quad-Cycle, 1-Second, 1-Quad-Second | Size of individual sample |
| Sample Method | RMS, Peak Max, Peak Min, Peak to Peak, Instantaneous | Sample measurement method |
| Channel Interval | Number of Sample Elements in an interval | Interval duration |
| Interval Method | Min, Max, Avg, RMS, Transient, Sum, | Interval measurement method |
| Transient Parameters | Min, Max, qualification period | Parameters to detect transients |
| Direction | Bi-directional, delivered, received | Direction of power flow |

FIG. 20

Channel Definition:

| | |
|---|---|
| Measure: | **Volts** |
| Reference: | **L1 – L2** |
| Sample Element: | **Cycle** |
| Sample Method: | **RMS** |
| Channel Interval: | **1 Cycle** |
| Interval Method: | **RMS** |
| Direction: | **Bi-Directional** |
| Channel Delivery: | **Null** |

Alarm Configuration:

| | |
|---|---|
| Minimum: | **–7V** |
| Maximum: | **+7V** |
| Duration: | **25 Intervals** |

+ optional Coincident channels sharing identical Channel Interval

+ subcycle Ampere & Volt waveform capture

FIG. 21

| Channel Definition: | | Alarm Configuration: | |
|---|---|---|---|
| Measure: | **Amperes** | Minimum: | **0** |
| Reference: | **L1 + L2** | Maximum: | **30 Amps** |
| Sample Element: | **Second** | Duration: | **12 Intervals** |
| Sample Method: | **RMS** | **+ optional Coincident channels sharing identical Channel Interval** | |
| Channel Interval: | **900 Seconds** | | |
| Interval Method: | **Min** | | |
| Direction: | **Delivered** | | |
| Channel Delivery: | **Null** | | |

FIG. 22

| **Channel Definition:** | | **Alarm Configuration:** | |
|---|---|---|---|
| Measure: | **Volts** | Minimum: | **0** |
| Reference: | **L1 + L2** | Maximum: | **1 Volt** |
| Sample Element: | **Second** | Duration: | **60 Intervals** |
| Sample Method: | **RMS** | **+ optional Coincident channels sharing identical Channel Interval** | |
| Channel Interval: | **1 Second** | | |
| Interval Method: | **RMS** | | |
| Direction: | **Received** | | |
| Channel Delivery: | **Null** | | |

FIG. 23

| Channel Definition: | | Alarm Configuration: | |
|---|---|---|---|
| Measure: | Volts | Minimum: | 0 |
| Reference: | L1 – N | Maximum: | 18 (1 %) |
| Sample Element: | Cycle | Duration: | 1 Interval |
| Sample Method: | P+ (Peak) | + optional Coincident channels sharing identical Channel Interval | |
| Channel Interval: | 1800 Cycles | | |
| Interval Method: | Transient | | |
| **Min:** | 100 V | | |
| **Max:** | 182 V | | |
| **Qual Period:** | 1 Cycle | | |
| Direction: | Bi-Directional | | |
| Channel Delivery: | Null | | |

FIG. 24

SYSTEM AND METHOD FOR MEASURING POWER QUALITY AT AN EDGE STRUCTURE

RELATED APPLICATIONS

This application claims priority to U.S. Provisional Patent Application No. 63/493,779 titled "System and Method for Intelligent Monitoring at the Edge of the Grid," filed Apr. 3, 2023, the disclosure of which is incorporated herein by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

This application relates to utility managed communications, and in particular, to systems and methods for utility managed communications that are able to perform intelligent monitoring at the edge of the grid.

Recently, residential and commercial structures and consumers have implemented a variety of distributed energy resources (DERs) that provide users with desirable power generation and power usage functionality. As an example, many structures now have electrical generation systems such as solar panels, generators, wind turbines or other electrical generation systems, battery energy storage systems, smart heating and hot water systems, smart thermostats, electric vehicle (EV) power coupling for charging or receiving power from EVs and other similar DERs. When a utility supplies power to a structure, it may be difficult to understand the varying electrical needs of that structure due to the presence of such DER components and to provide a quality power supply that takes into account the impact that DERs have on the utility's power distribution system.

Furthermore, with the roll out of high speed fiber optic networks to residential homes, utilities have the opportunity to collect high quality power measurements that were not previously possible. These measurements would aid in the ability to manage the overall distribution grid and provide monitoring, and much more precise identification of potentially harmful or catastrophic failures of the electrical distribution system. However, there are at present no devices designed to comprehensively monitor and measure electrical usage of DERs at edge structures and report the data and alarms back to utilities.

SUMMARY OF THE INVENTION

The above and other problems are solved by various aspects of the apparatuses, systems, and methods described herein. One such apparatus comprises a monitoring unit configured to be electrically disposed between a panel assembly of a structure situated at the edge or terminal of an electric utility network and an electric service meter for the structure. The monitoring unit comprises first means for electrical coupling to the panel assembly and second means for electronically coupling to the electric service meter. In some embodiments, the first means comprises a plurality of blades configured for insertion into a plurality of jaws of the panel assembly to electrically couple the monitoring unit to the panel assembly and the second means comprises a meter socket having a plurality of jaws configured to receive a plurality of blades in the electric service meter.

In some embodiments, the monitoring unit comprises a neutral blade configured for insertion into a neutral jaw of the panel assembly. In other embodiments, the monitoring unit comprises a leader line extending along a surface of the monitoring unit, the leader line comprising a connector configured to couple to a lead wire, the lead wire being configured for attachment to a portion of the panel assembly corresponding to a neutral jaw.

In some embodiments, the monitoring unit comprises a disconnect mechanism configured to electrically uncouple circuitry of the monitoring unit from the panel assembly. The disconnect mechanism may be configured to electrically uncouple the circuitry of the monitoring unit without disconnecting power to the structure, and may comprise at least one fuse that is electrically interposed between the circuitry of the monitoring system and the panel assembly.

In some embodiments, the monitoring unit comprises a service hatch, the service hatch being actuatable to expose the disconnect mechanism and the disconnect mechanism being configured to translate relative to the service hatch to electrically uncouple the circuitry of the monitoring system from the panel assembly. The disconnect mechanism may be at least partially removable from the monitoring unit to expose at least one other component of the monitoring unit, the at least one other component being removable from the monitoring unit when the disconnect mechanism is at least partially removed from the monitoring unit.

In certain embodiments, the monitoring unit comprises a plurality of communication interfaces configured to serve as an access point for a plurality of distributed energy resources associated with the structure, such as solar panels or electric vehicle charging devices, the monitoring unit being configured to at least one of partially monitor and control functionality of a given distributed energy resource of the plurality of distributed energy resources that is utilizing the monitoring unit as an access point. wherein the given distributed energy resource comprises. The monitoring unit may be configured to pass communications between the given distributed energy resource and a vendor associated with the given distributed energy resource.

In some embodiments, the monitoring unit comprises an expansion interface component configured to couple to one or more modular daughter boards each configured to extend a functionality of the monitoring unit. As an example, the monitoring unit may be coupled to a cellular modem daughter-card configured to provide a connection between the monitoring unit to an electrical utility system.

In some embodiments, the monitoring unit comprises an actuatable service hatch. The service hatch may be actuatable to expose a connection for a fiber or ethernet line, the connection being accessible when the monitoring unit is coupled to the panel assembly to connect a fiber or ethernet line to the monitoring unit. The service hatch may be actuatable to expose a power backup component of the monitoring unit, the power backup component being configured to supply power to the monitoring unit in a case where the monitoring unit is not receiving power from the panel assembly while electrically coupled to the panel assembly. The service hatch may also provide power for an external device.

In accordance with other aspects of the present invention, a system for monitoring and controlling power usage at a structure is described, where the structure has an electrical panel assembly and one or more distributed energy resources. The system comprises a modular energy intelligence unit (MEIU) configured for electrical coupling to the panel assembly and to an electric service meter such that the MEIU may be electrically disposed between the panel assembly and the electric service meter and communication interfaces coupled to the MEIU and configured to serve as an access point for the one or more distributed energy resources. The MEIU is configured to at least partially control functionality of the one or more distributed energy resources that is utilizing the MEIU as an access point. The system also comprises a measurement unit coupled to the MEIU configured to measure a plurality of electrical values associated with the panel assembly or the structure.

In some embodiments, the MEIU comprises a first cable connection and the system further comprises a meter cap having a second cable connection configured for electrical coupling to the first cable connection. The meter cap may comprise at least one modular component configured for replacement in the field, the at least modular component comprising a display module, an optical interface module, a user interface module and/or a relay configured to remotely disconnect the electrical service at the structure.

In some embodiments, the MEIU comprises a plurality of blades configured for insertion into a plurality of jaws of the panel assembly to electrically couple the monitoring unit to the panel assembly, and wherein the measurement unit is connected to the blades. The MEIU may further provide access through the communication interfaces to power line carrier, WiFi, and advanced metering infrastructure network communications.

In accordance with other aspects of the present invention, a meter cap is described, the meter cap being configured for use with a monitoring unit configured to be electrically coupled to a panel assembly connected to an electric power utility network and associated with a structure, the monitoring unit having a first cable connection and one or more jaws, The meter cap comprises a second cable connection configured for electrical coupling to the first cable connection, one or more blades for engaging the one or more jaws of the monitoring unit, and at least one modular component configured for replacement in the field. The meter cap combined with the monitoring unit may function as a revenue grade electric meter.

In some embodiments, the meter cap receives data from and transmits data to the monitoring unit over the electrically coupled first and second cable connections. In some embodiments, the modular component comprises a display module such as a liquid crystal display., an optical interface module, a user interface module, and/or a relay configured to remotely disconnect the electrical service at the structure. The one or more relays may be configured to remotely disconnect the electrical service at the structure by interrupting power flowing between one or more blades in the monitoring unit and the panel assembly at the structure. In some embodiments, the meter cap further comprises a cover to inhibit removal of the modular component by unauthorized individuals and a tamper ring to secure the cover to the meter cap and/or monitoring unit.

The above and other problems may also be at least partially solved by a system for measuring power quality at a structure receiving electrical power from a utility, the system comprising a monitoring unit configured to be electrically coupled to a panel assembly of the structure and to an electric service meter and a measurement unit coupled to the monitoring unit and configured to measure a plurality of electrical values associated with the panel assembly. In some embodiments, the monitoring unit comprises a plurality of blades configured for insertion into a plurality of jaws of the panel assembly to electrically couple the monitoring unit to the panel assembly, and wherein the measurement unit is connected to the blades.

In some embodiments, the measurement unit is configured to detect power quality events based on the measured electrical values and to transmit the detected power quality events to a remote reporting system. The measurement unit may be configured to generate power measurement waveforms based on the measured electrical values and may further comprise a pattern recognition system to detect events in the power measurement waveforms. The power quality events include high speed voltage transients. The system may be configured to detect events based on a logical combination of individual events from the electrical power measurements measured by the measurement unit.

In some embodiments, the system is configured to capture data from any combination of power measurement channels when an event is detected allowing the recording of measurements that coincide with the detected event. The system may further be configured to detect events that are detectable at a specific location in an electric grid to allow the reporting system to aggregate a plurality of such events received from different monitoring units to coordinate a grid wide view of distribution events.

In accordance with certain aspects of the present invention, a system is provided for measuring power quality on an electrical grid. The system comprises monitoring systems installed at a plurality of edge structures receiving power via the electrical grid, each monitoring system configured to be electrically coupled to a panel assembly of the structure at which it is installed and to an electric service meter at such structure, and each monitoring system comprising a measurement unit configured to measure a plurality of electrical values associated with the panel assembly at the structure and to detect power quality events based on the measured electrical values. The system also includes a reporting system communicatively coupled to the monitoring systems and configured to receive data representing the detected power quality events from the monitoring systems.

In some embodiments, the reporting system detects patterns of disruption within the electrical grid through pattern matching of detected power quality events received from the plurality of monitoring systems. The pattern matching may be detected through a neural network, machine learning model, or statistical model. The reporting system may download data captured by the monitoring systems associated with the detected power quality events, may comprise a user interface module to enable an operator to select events and files to download from a monitoring system, and may reporting system automatically select data to download from the monitoring systems. The reporting system may be further configured to analyze the received power quality events and associated downloaded data to identify a probability of a complex event and to report this data to a user.

In some embodiments, the reporting system is configured to allow a user to reconfigure one or more of the monitoring systems to further refine power measurements. The reporting system may be configured to receive refined power measurements from such reconfigured monitoring systems and triangulate a source of a disturbance in the electrical grid based on the refined power measurements.

The above and other problems are also at least partially addressed by a system for managing a plurality of distributed energy resources, such as solar panels or electric vehicle charging devices, associated with a structure, such as a house, at the edge of an electrical utility network. The system comprises a monitoring unit configured to be electrically coupled to a panel assembly of the structure, and communication interfaces coupled to the monitoring unit and configured to serve as an access point for the distributed energy resources. The monitoring unit is configured to partially monitor and/or control functionality of a given distributed energy resource of the plurality of distributed energy resources that is utilizing the access point. The monitoring unit may be configured to operate as part of a Distributed Energy Resource Management system or a Supervisory Control and Data Acquisition system of a power utility.

In some embodiments, the monitoring unit is further configured to pass communications between the given distributed energy resource and a vendor associated with the given distributed energy resource. The communications may be passed between the given distributed energy resource and the associated vendor over a secure network connection.

In some embodiments, the monitoring unit comprises an expansion interface component configured to couple to a modular daughter board configured to extend a functionality of the monitoring unit. The modular daughter board may be configured to extend a control or communication functionality of the monitoring unit.

In some embodiment, the monitoring unit is configured to at least partially control functionality of plurality of distributed energy resources utilizing the access point. The distributed energy resources may use different types of communication protocols and the monitoring unit may be configured to interface with the plurality of distributed energy resources using the different types of communication protocols.

BRIEF DESCRIPTION OF THE DRAWINGS

The invention is illustrated in the figures of the accompanying drawings which are meant to be exemplary and not limiting, in which like references are intended to refer to like or corresponding parts.

FIG. 20 is a chart showing sample measurement channels, and standard measurement units, measured by the system of FIG. 19 in accordance with embodiments of the invention; and FIGS. 21-24 are data from exemplary power quality events detected in accordance with the system of FIG. 19 and in accordance with embodiments of the invention.

DETAILED DESCRIPTION

Subject matter will now be described more fully hereinafter with reference to the accompanying drawings, which form a part hereof, and which show, by way of illustration, exemplary embodiments in which the invention may be practiced. Subject matter may, however, be embodied in a variety of different forms and, therefore, covered or claimed subject matter is intended to be construed as not being limited to any example embodiments set forth herein; example embodiments are provided merely to be illustrative. It is to be understood that other embodiments may be utilized and structural changes may be made without departing from the scope of the illustrative embodiments. Likewise, a reasonably broad scope for claimed or covered subject matter is intended. Throughout the specification and claims, terms may have nuanced meanings suggested or implied in context beyond an explicitly stated meaning. Likewise, the phrase “in one embodiment” as used herein does not necessarily refer to the same embodiment and the phrase “in another embodiment” as used herein does not necessarily refer to a different embodiment. It is intended, for example, that claimed subject matter include combinations of exemplary embodiments in whole or in part. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Figure 1:
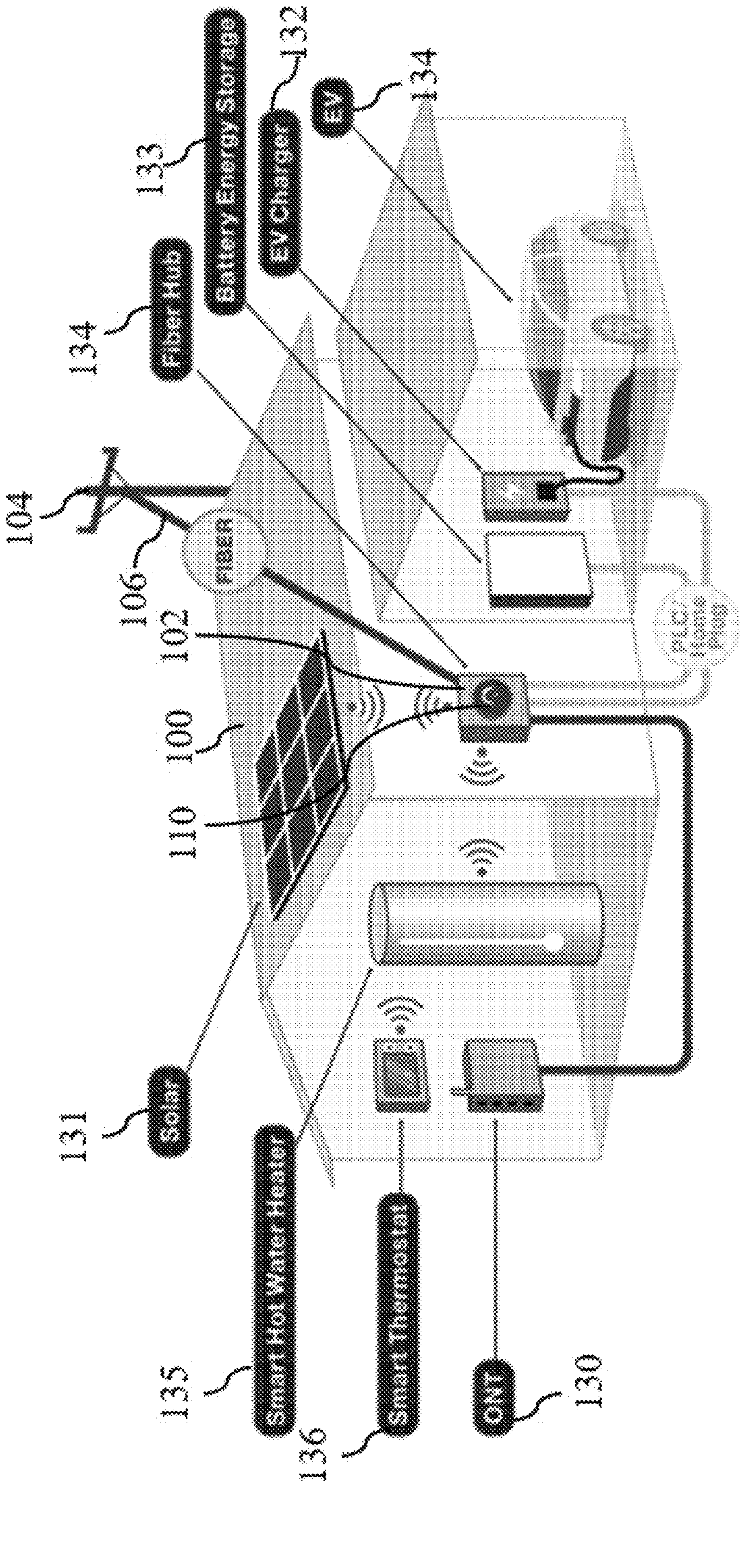
FIG. 1 is a perspective view of an exemplary edge structure connected to an electric utility and having distributed energy resources, in accordance with an embodiment of the invention.

Utilities often need to understand the power needs of consumers at the edge of the grid in order to anticipate power needs and adjust the power supply. For example, consumers often install a variety of distributed energy resources (DERs) at their structures situated at the edge or terminal point of an electric utility grid or system that either provide power, make power usage more efficient or consume power. The utility may desire to obtain additional information on the DER usage and requirements of a structure in order to plan out power distribution accordingly. With reference to FIG. 1, an example structure 100 is illustrated. As shown in FIG. 1, multiple DERs have been installed in, on and around structure 100. Structure 100 also comprises a panel assembly 102 that is connected to a telephone pole 104 or another component that conveys power, data or both to structure 100. As shown in FIG. 1, for example, panel 102 is connected to telephone pole 104 by a fiber line 106 which is connected to a fiber hub 134. Other data transfer components may also or alternatively be utilized to connect panel 102 to an outside network including, e.g., mobile data components, wireless data components, other types of wired data components or any other data transfer components.

Structure 100 may also comprise an optical network terminal (ONT) 130 that is configured to connect to the outside network, e.g., via connection to telephone pole 104 directly, via panel 102, via fiber hub 134 or in any other manner. The ONT is configured to provide wired and wireless connectivity to various devices within and around structure 100.

As shown in FIG. 1, some example DERs may include solar panels 131, smart hot water heaters 135, smart thermostats 136, battery energy storage 133, electric vehicle (EV) chargers 132, EVs 134 themselves connected to EV chargers 132 or any other DER. As an example, EVs may consume power to charge its batteries via an EV Charger 132 and may also or alternatively supply power back into the structure 100 via the EV charger 132. Energy can also be stored in a battery energy storage unit 133 connected to the panel 102 or another device in order to provide power for the home 100, or alternatively to provide power back to the electric grid via the electrical connection to the pole 104.

In some embodiments, power connections to various DERs may support power line communication (PLC) connectivity that is configured to allow data or other information to pass between the DER and panel 102, e.g., the power lines supplying power from panel 102 to the corresponding DER. DERs may also or alternatively comprise other wired or wireless communication mechanisms for communicating with panel 102, the ONT, any other component of structure 100 or to a network outside of structure 100.

With reference to FIGS. 1-4, panel 102 comprises a meter socket 108 (FIG. 2) that is configured to electrically couple to an Electric Service Meter 110. Meter socket 108 comprises four jaws 112 that are configured to receive corresponding blades 114 of an Electric Service Meter 110 to establish an electrical connection between panel 102 and Electric Service Meter 110. Although the meter socket 108 and Electric Service Meter 110 are shown as having four jaws and four corresponding blades, respectively, one of ordinary skill in the art would understand that some sockets and meters have different numbers of jaws and blades. The Electric Service Meter 110 is configured to monitor power usage based on the electrical connections between jaws 112 and blades 114. Power is supplied to panel 102 via a power line 116 and to the Electric Service Meter 110 via jaws 112 and blades 114. While coupling an Electric Service Meter 110 to a panel 102 via meter socket 108 provides basic monitoring of the power supplied to the structure 100, a device for performing intelligent monitoring at the edge of the grid is needed.

Figure 2:
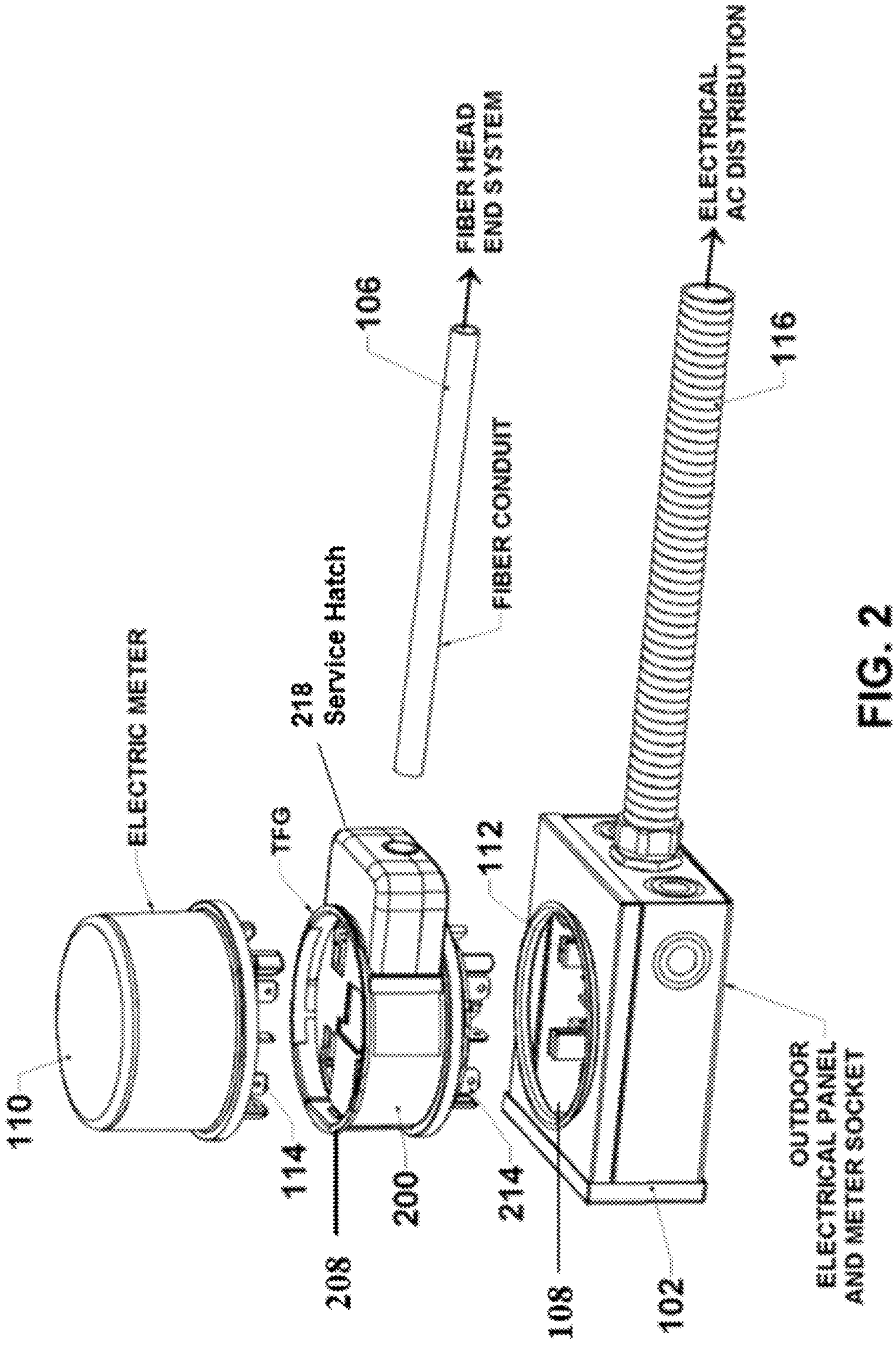
FIG. 2 is an exploded view of a modular energy intelligence unit (MEIU) in accordance with one embodiment of the present invention connected between a panel assembly of an edge structure and an electric meter.
Figure 3B:
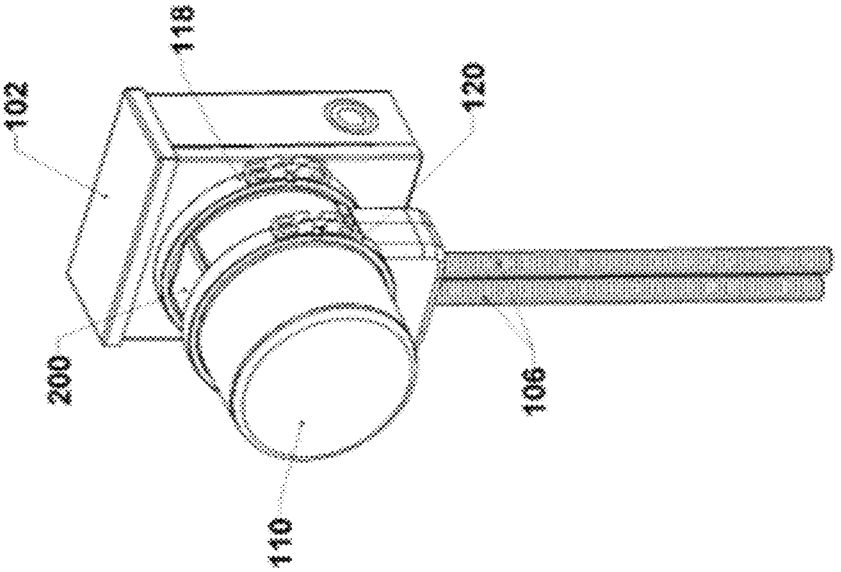
FIGS. 3A-3B are perspective views of embodiments of the MEIU of FIG. 2 connected to the panel assembly and electric meter.
Figure 3A:
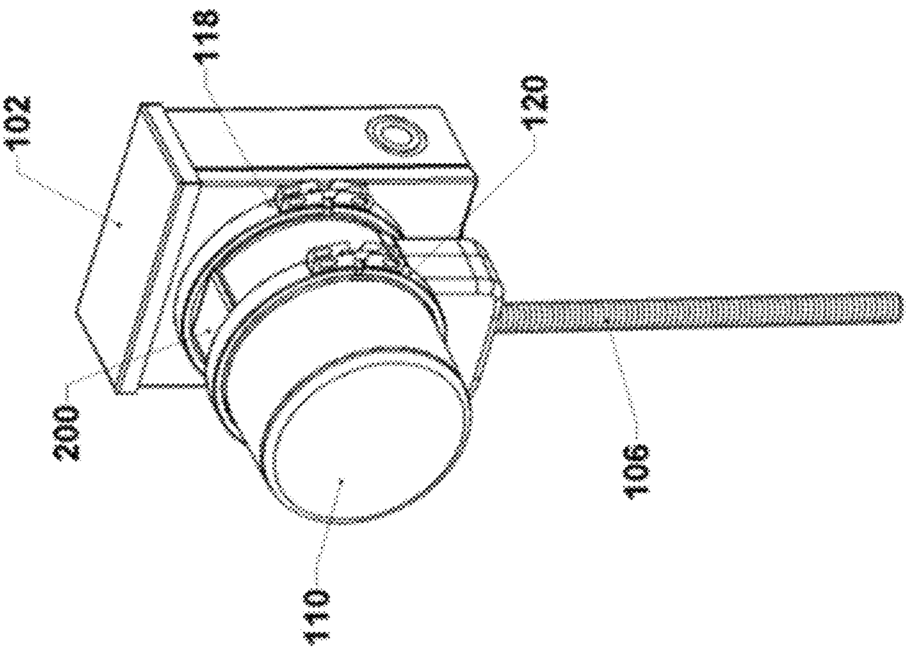

A modular energy intelligence unit (MEIU) 200 is disclosed that provides the ability for an electric utility to enable intelligent monitoring at the edge of the grid, e.g., at the structures 100 of consumers. MEIU 200 is configured to electrically couple to meter socket 108 of structure 100 via an insertion of corresponding blades 214 of MEIU 200 into jaws 112 of meter socket 108, e.g., in a similar manner to the Electric Service Meter 110. In addition, in some embodiments, MEIU 200 also comprises a meter socket 208 having jaws 212 that are configured to receive blades 114 of the Electric Service Meter 110 in a similar manner to meter socket 108. For example, as shown in FIGS. 2, 3A and 3B, MEIU 200 is configured to couple between meter socket 108 and Electric Service Meter 110 to electrically couple Electric Service Meter 110 to meter socket 108, e.g., the electrical coupling of jaws 112 of meter socket 108 to blades 214 of MEIU 200 and jaws 212 of MEIU 200 to blades 114 of the Electric Service Meter 110. In other embodiments, MEIU 200 may form part of an integrated meter through the addition of the Meter Cap, described further below herein, where, for example, a coupling to a separate meter may not be needed. MEIU 200 also comprises a connection for fiber line 106.

Figure 10:
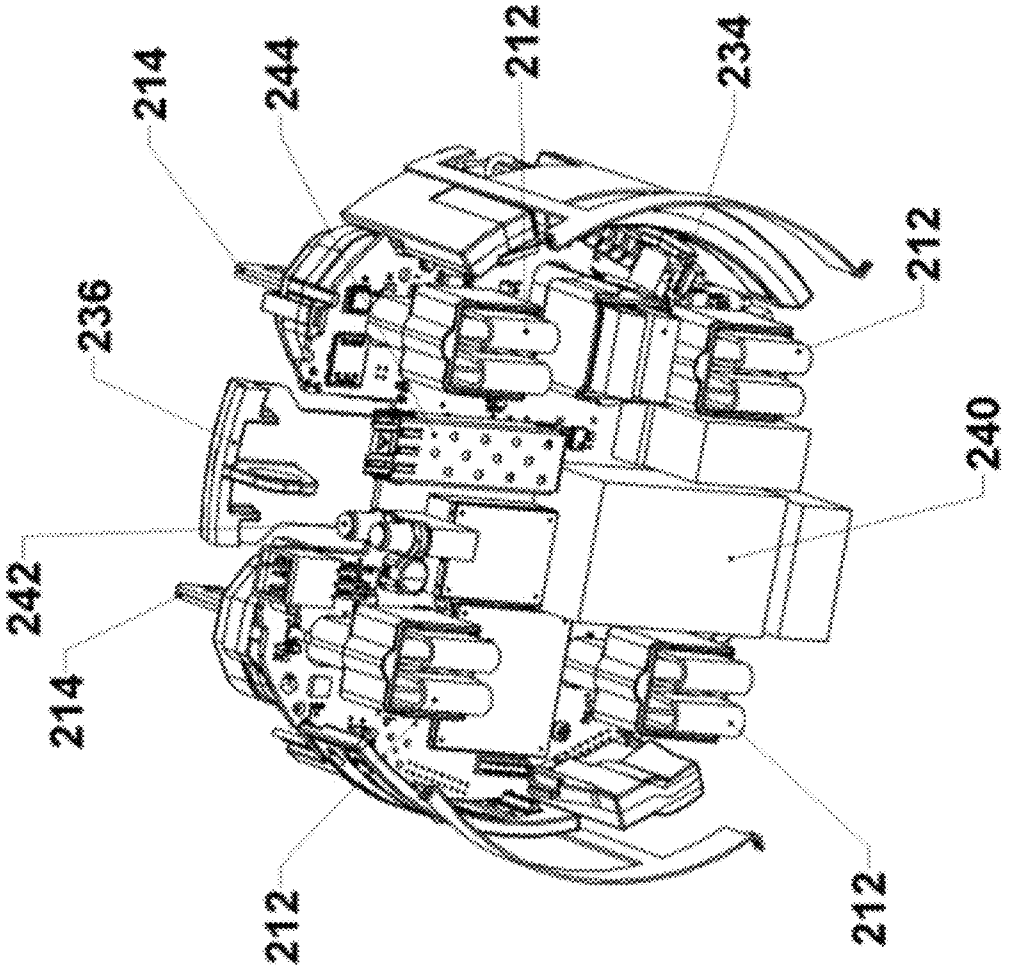
Figure 11:
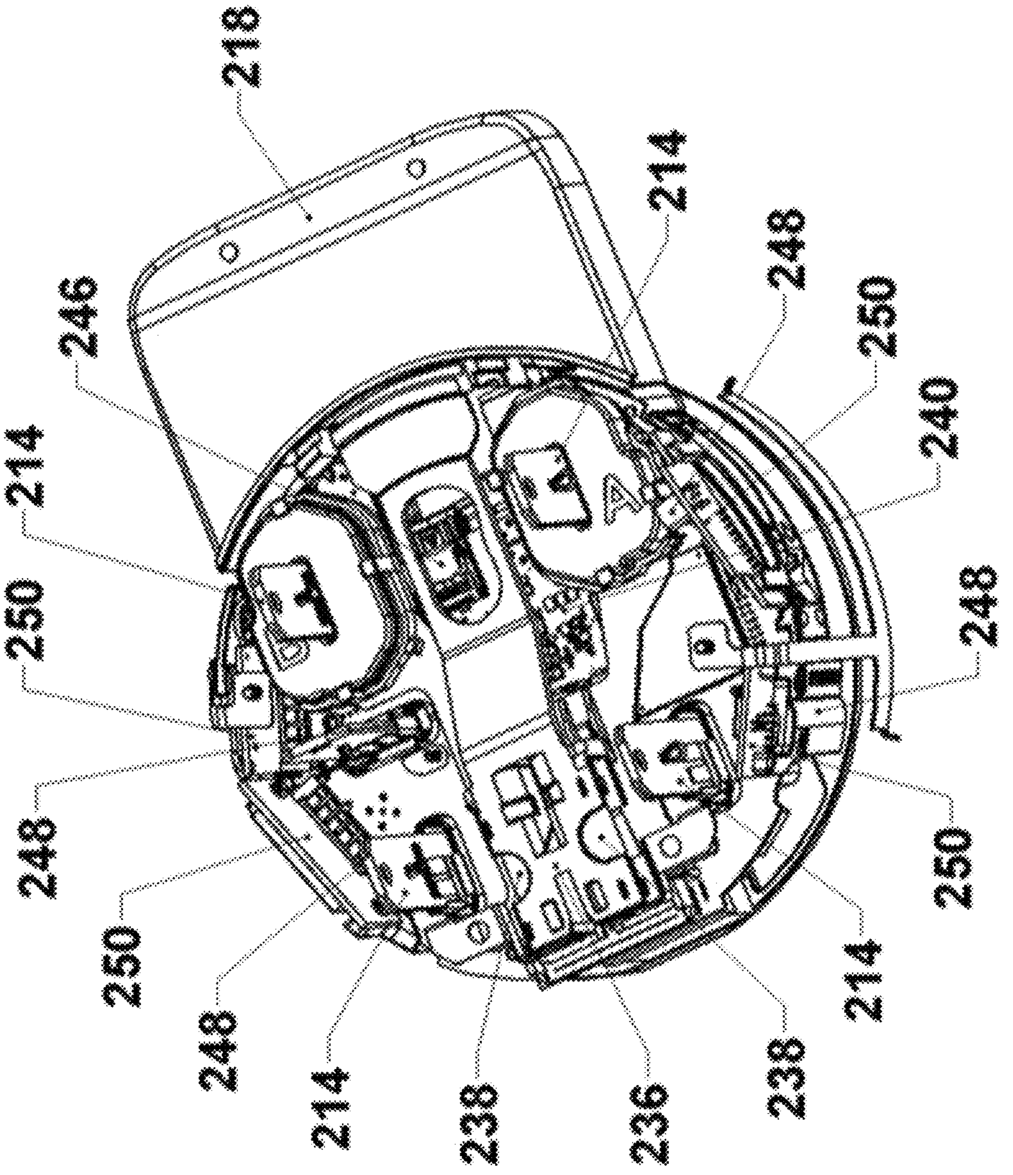
Figure 18:
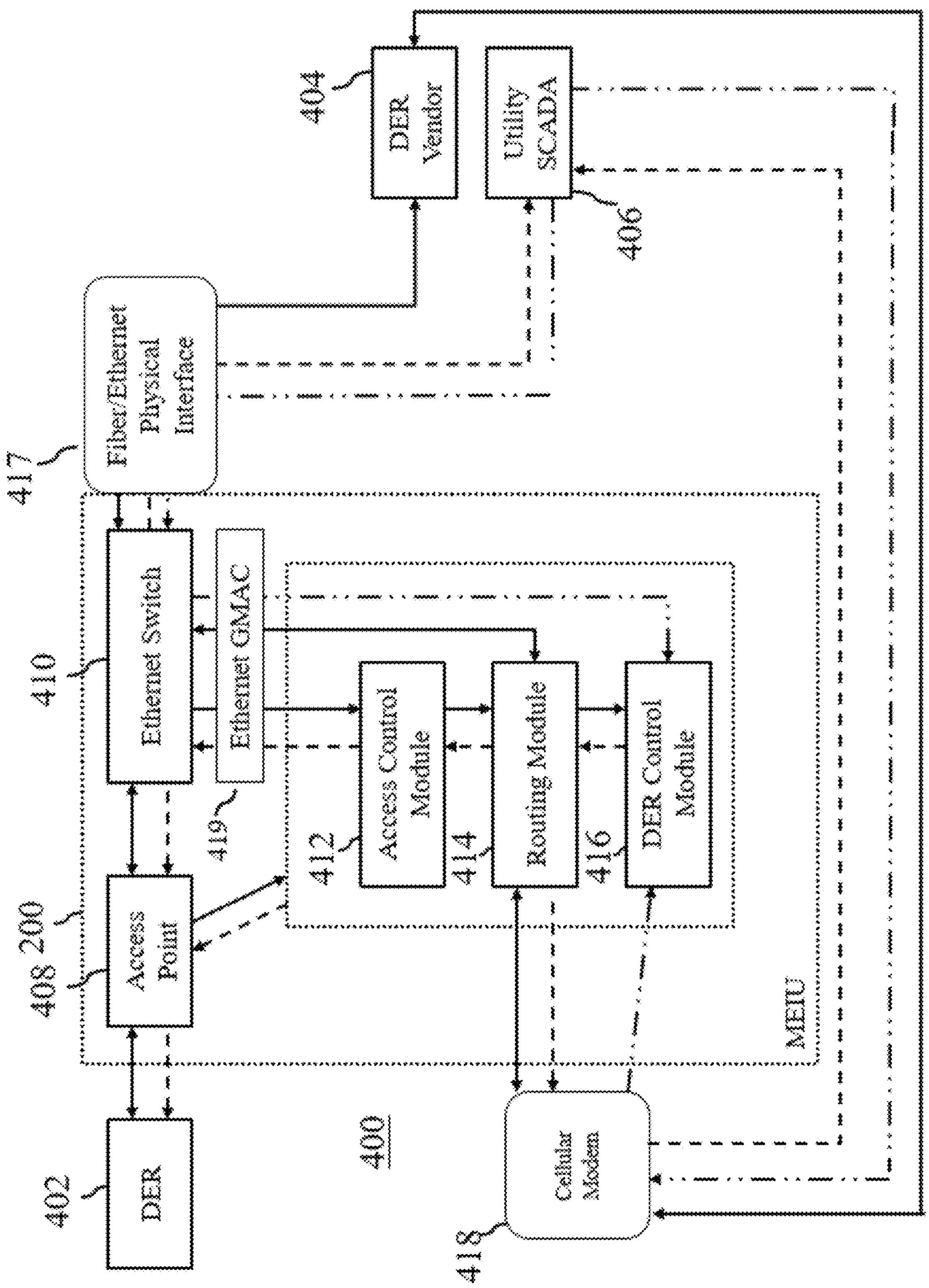
FIG. 18 is a block diagram of components of the MEIU in accordance with embodiments of the invention.

In some embodiments, MEIU 200 may comprise a connection for a single fiber line 106, for example, as shown in FIG. 3A. This provides the network connection between the MEIU 200 and the ONT 130 which can be located inside or outside of the home. In other embodiments, MEIU 200 may comprise connections for multiple fiber lines 106, e.g., two lines as shown in FIG. 3B or any other number of fiber lines 106. For example, MEIU 200 may comprise a service hatch 218 having a port 220 for receiving one or more fiber lines 106. Service hatch 218 is configured to open, e.g., via a hinge 222, snap fit or another mechanism. In another embodiment the connection from the MEIU 200 to the ONT 137 can be via an ethernet connection (106) or any other medium supported through the standard Small Form Pluggable (SFP and SFP+) interface and is not limited to fiber. In another embodiment the MEIU incorporates an ethernet PHY interface without an SFP to provide a direct ethernet or fiber connection without the use of an SFP. In another embodiment the network communication from the MEIU 200 back to the reporting system 538 (FIG. 19) is provided by the cellular modem 418 (FIG. 18). This enables the MEIU to be installed in remote locations that do not have cellular service. The cellular modem 418 is incorporated through the use of a daughter card 250 (FIG. 11). The cellular modem 418 requires a SIM card to gain access to a given cellular network. The MEIU provides access to install the SIM card within the service hatch 218. The service hatch 218 also provides access to an antenna connector 242 (FIG. 10) so that an external antenna can be connected to provide service is more challenging remote environments where the cellular signal is not strong enough at the meter socket where the MEIU is installed. The external antenna connection allows the utility to position the antenna in such a way that that an acceptable cellular signal can be obtained.

As shown in the embodiments of FIGS. 3A and 3B, tamper rings 118 and 120 may be attached to panel 102, MEIU 200 and Electric Service Meter 110 to secure Electric Service Meter 110 to MEIU 200 and MEIU 200 to panel 102. In some embodiments, for example, tamper rings 118 and 120 may comprise a locking mechanism or be configured to accept a seal for securing Electric Service Meter 110 to MEIU 200 and MEIU 200 to panel 102 and to inhibit tampering or removal of MEIU 200 or Electric Service Meter 110 by unauthorized parties. In some embodiments, tamper ring 120 may be configured to engage against service hatch 218 when installed to inhibit an opening of service hatch 218 about hinge 222. In other embodiments, hinge may be positioned such that service hatch 218 may be opened without requiring removal of tamper ring 120. In some embodiments, service hatch 218 may comprise its own locking mechanism to inhibit tampering.

Figure 4:
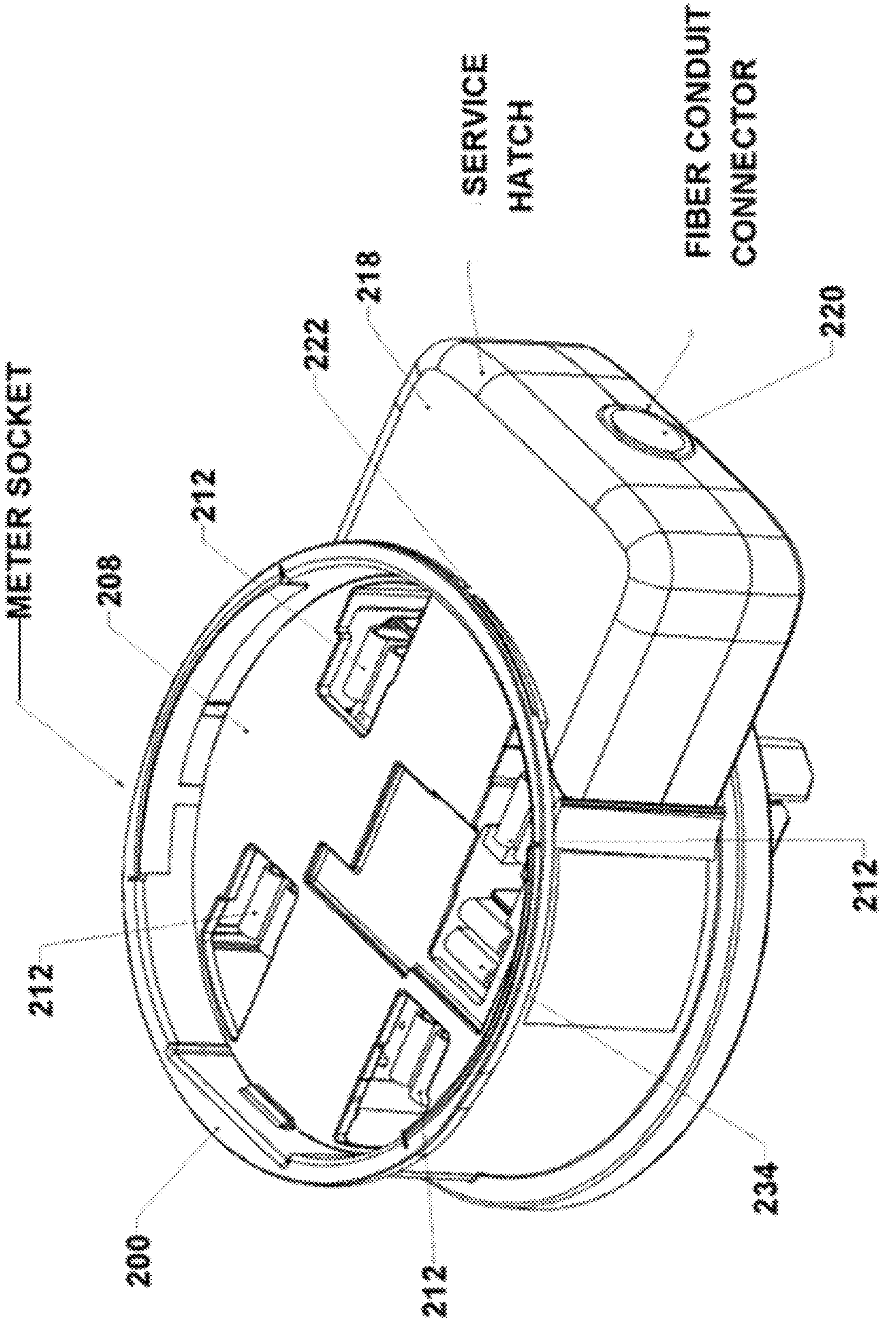
FIG. 4 is a perspective view of the MEIU in accordance with an embodiment of the invention.
Figure 5:
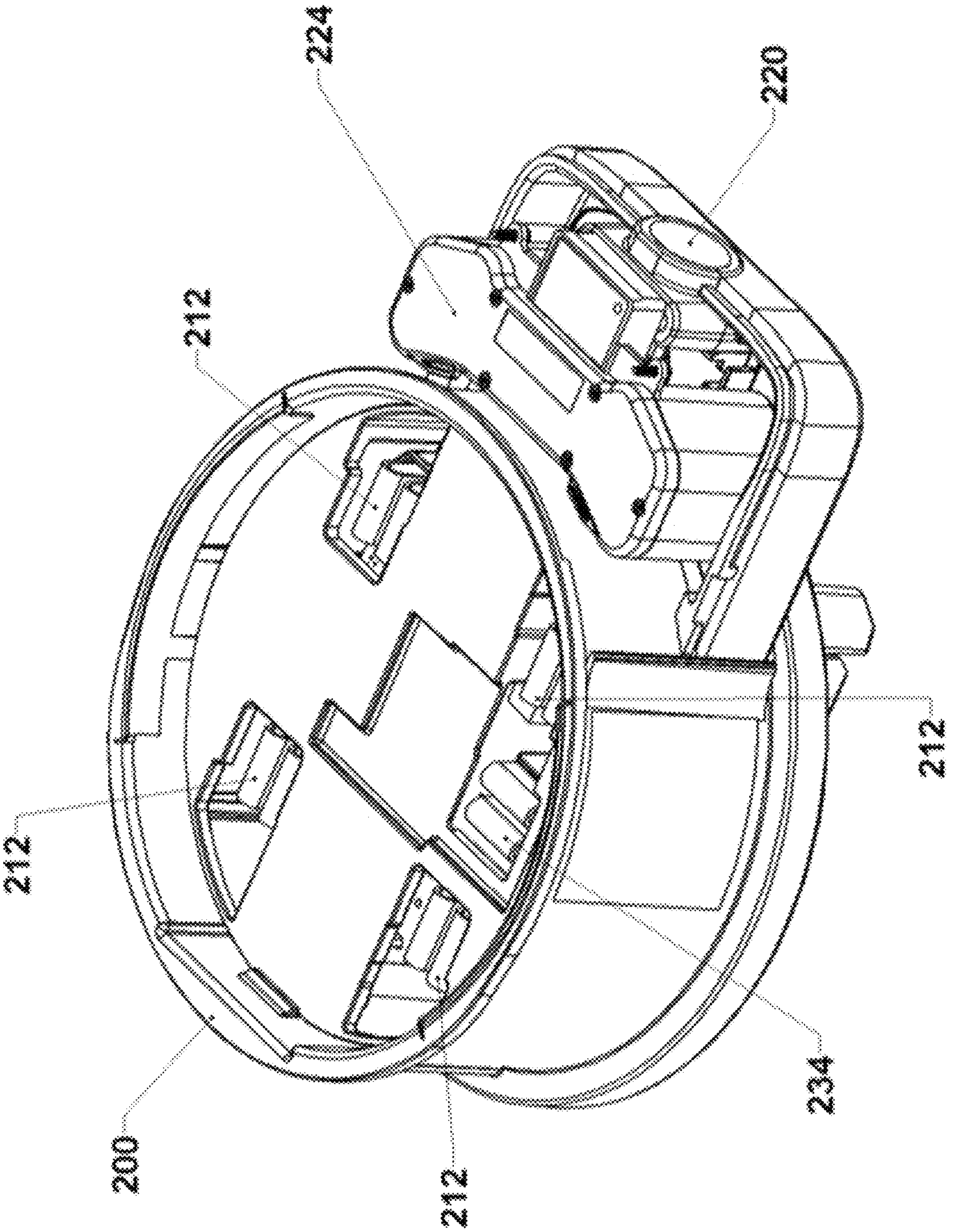
FIG. 5 is a perspective view of the MEIU with the service hatch uncovered in accordance with an embodiment of the invention.

With reference to FIGS. 4-5, service hatch 218 comprises an energy storage unit (ESU) 224 that is configured to provide back-up power to MEIU 200 in the event of a power failure, disconnect, fuse failure or for any other reason. ESU 224 enables MEIU 200 to operate and continue providing data to the utility even where power has been lost for an amount of time based on a stored charge on ESU 224 and a power consumption of MEIU 200. ESU 224 may comprise, for example, circuitry, batteries, capacitors, super capacitors, or other power storage components that may be charged by MEIU 200 during operating conditions where MEIU 200 is powered by the grid and discharged during operating conditions where MEIU 200 is disconnected, underpowered or unpowered by the grid to supply power to MEIU 200, e.g., due to an outage, failed fuse or for any other reason. As an example, MEIU 200 may utilize ESU 224 to power MEIU 200 during an outage to continue providing data and other reports to the utility, to send a notification to the Power Utility Head End System (HES) about the outage or to perform other functions. The notification from MEIU 200 to the HES when on back-up battery power allows enhanced tracking and identification of failures in the grid even when no active power supply is available. ESU 224 is also replaceable via service hatch 218, enabling an extension of the functional life of MEIU 200 since batteries and other charge carrying components may tend to wear out or degrade faster due to usage and environmental factors than other components of MEIU 200. In another embodiment the MEIU may provide power to the external ONT and via the ESU 224 for the purpose of enabling the reliable delivery of power outage notifications. In this embodiment the MEIU provides power for the ONT and uses the ESU to continue to provide power after a loss of service power long enough for an outage report to be sent back to the utility.

Figure 6:
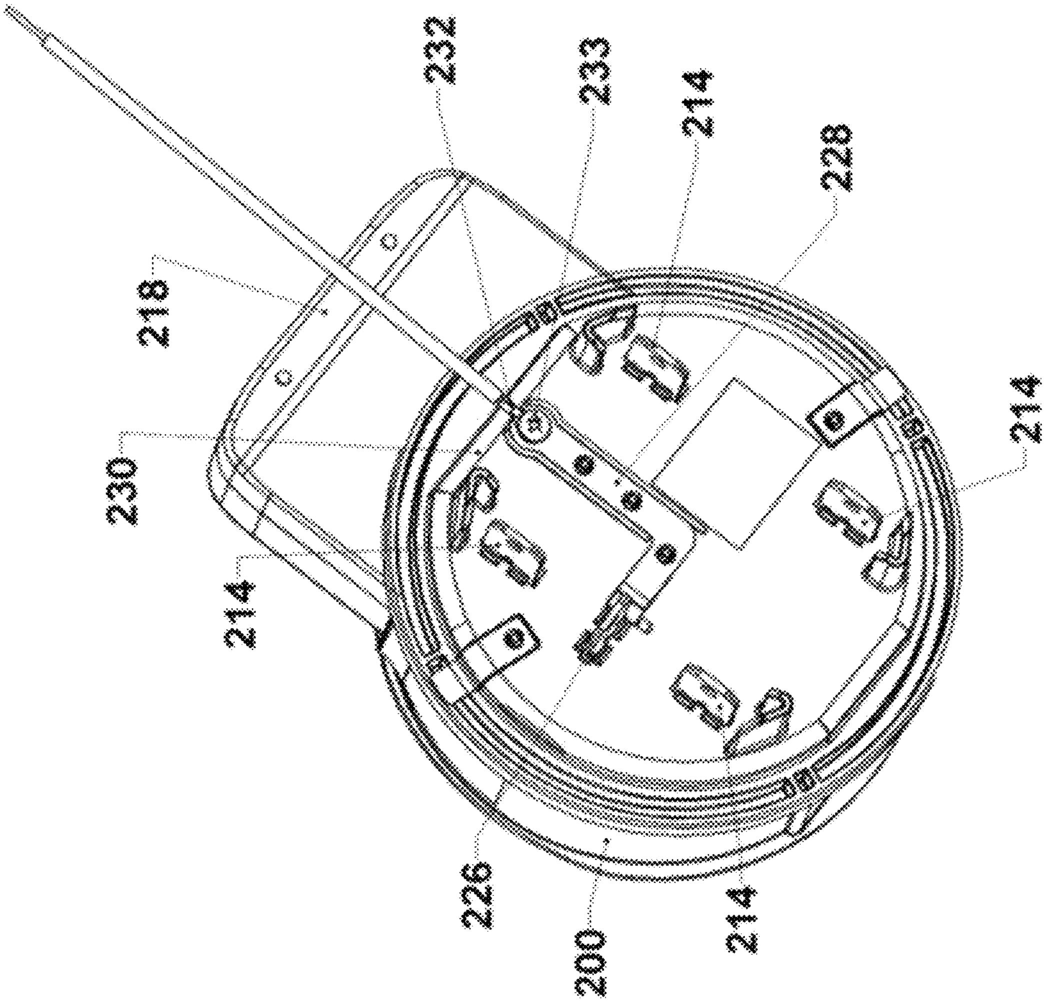
FIG. 6 is a perspective view of the MEIU with a leader line attached in accordance with an embodiment of the invention.
Figure 7:
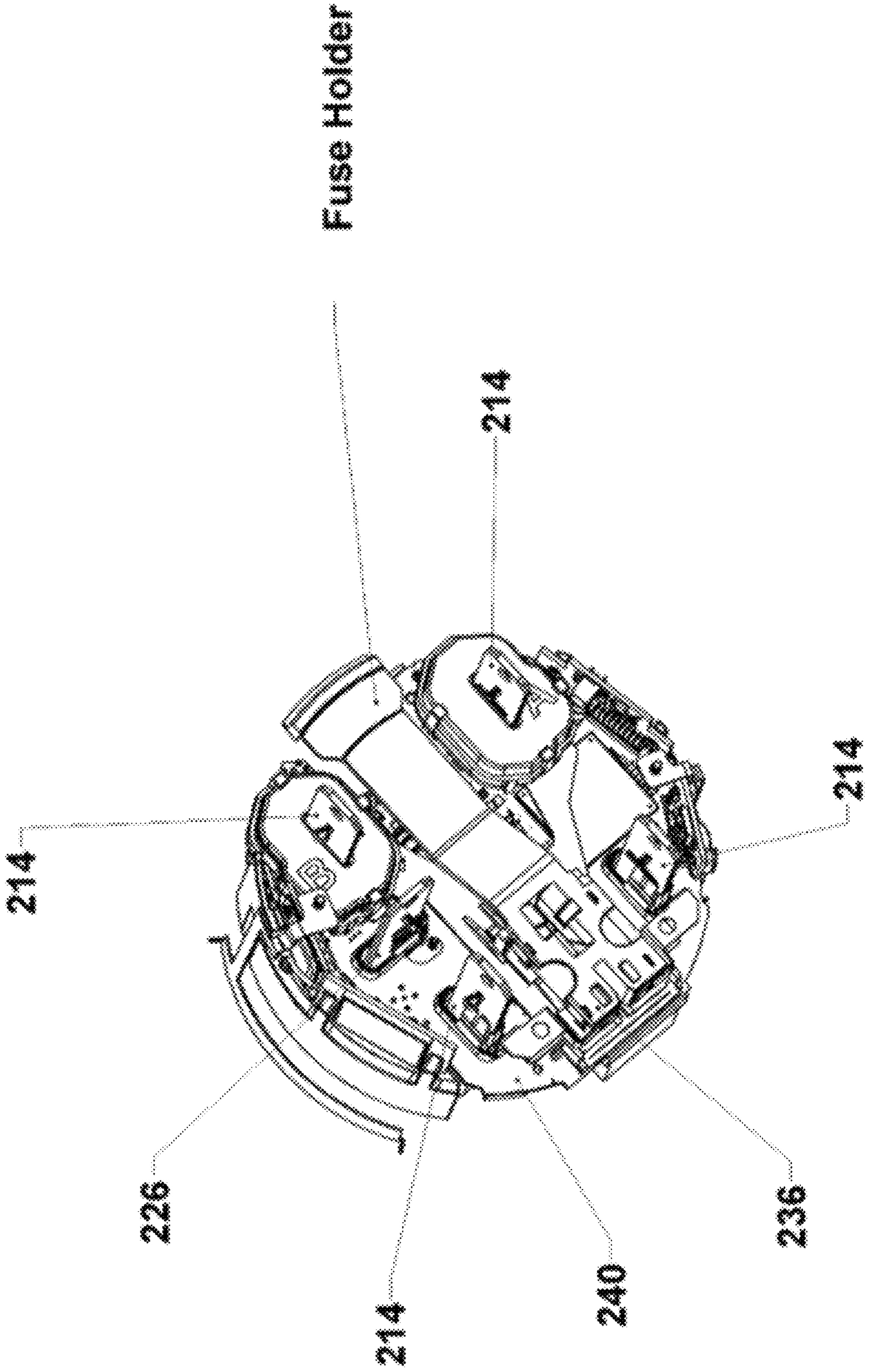
FIG. 7-14 are perspective views of the MEIU from various sides, with the cover removed, in accordance with embodiments of the invention.
Figure 8:
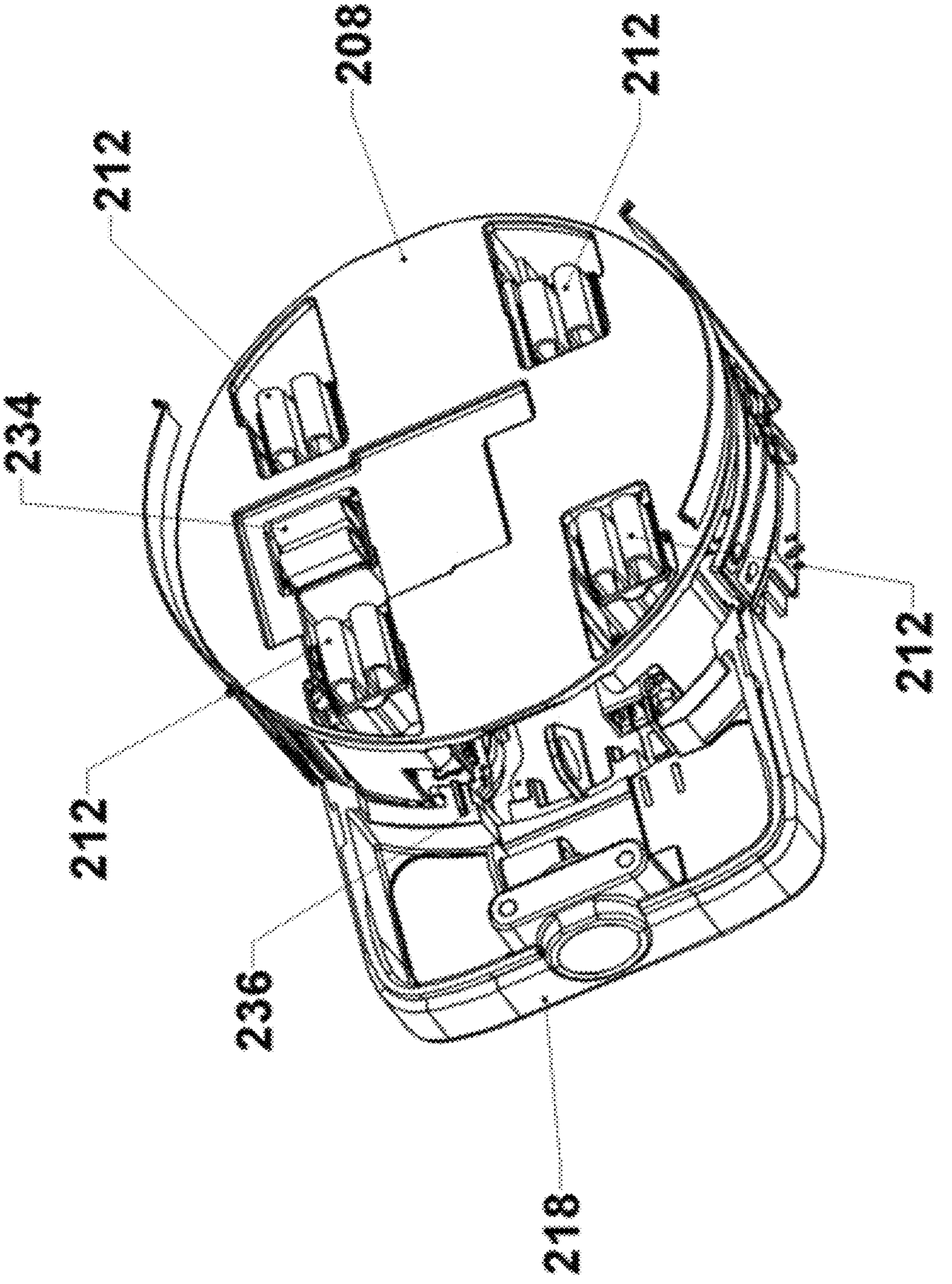
Figure 9:
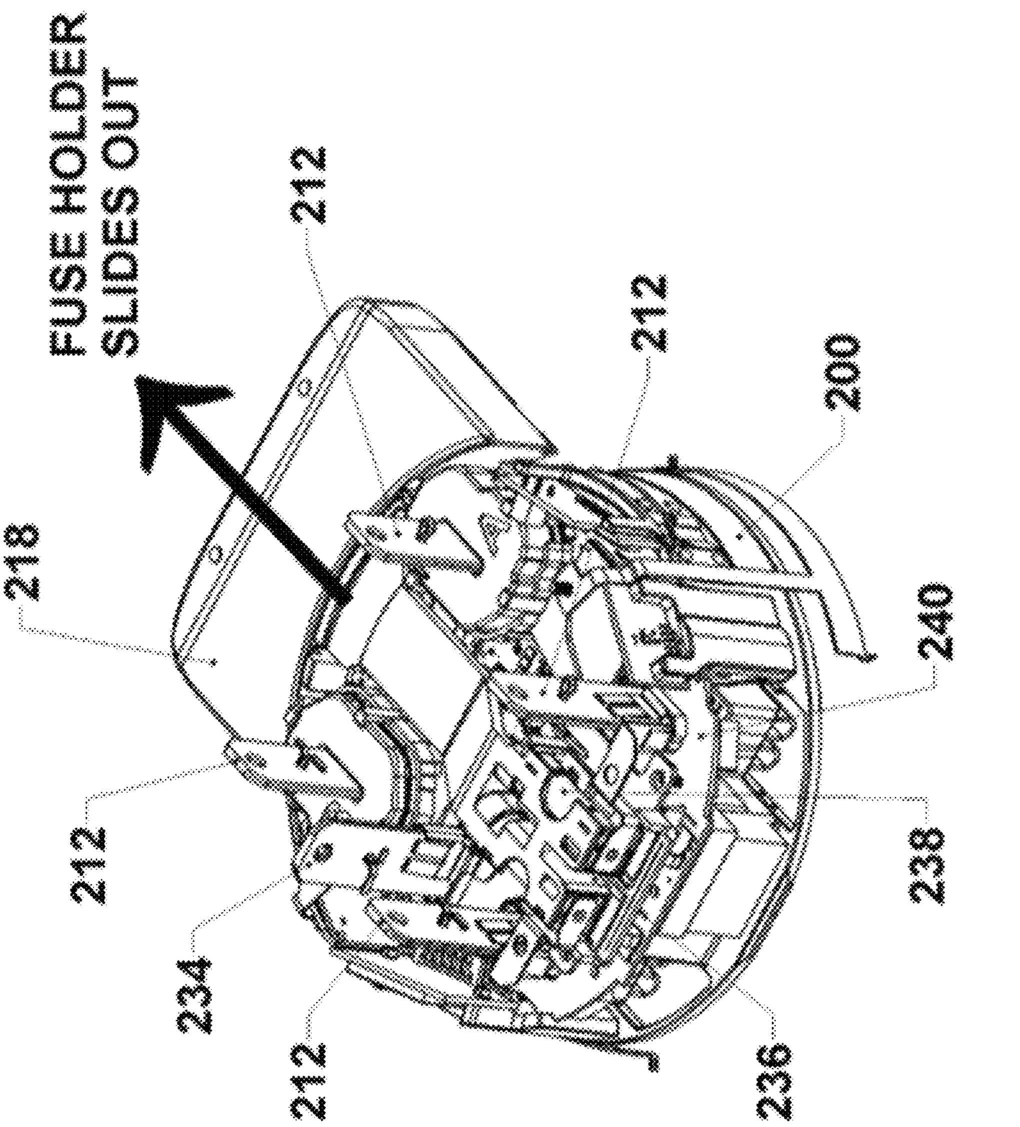

With reference to FIG. 6, in some embodiments, MEIU 200 comprises a neutral blade 226 that is configured for coupling with a corresponding neutral jaw of some panels 102 to provide a neutral connection to MEIU 200. In a case where a neutral jaw is not present in panel 102, a leader 228 is also coupled to neutral blade 226 that extends between neutral blade 226 and an edge portion 230 of MEIU 200. In some embodiments, for example, the edge portion 230 may be underneath or adjacent to service hatch 218. In other embodiments, leader 228 may extend to any other portion or edge of MEIU 200 for electrical coupling to a corresponding neutral connection of panel 102.

In some embodiments, leader 228 comprises a connector 232, e.g., a socket, washer connector or other component, that is coupled to a neutral lead wire or other component, e.g., by crimping or in another manner. As an example, a neutral lead wire (not shown) may be crimped to connector 232 and provided with connector 228 as part of MEIU 200. In a case where panel 102 comprises a neutral jaw, connector 232 is not needed and may be either disregarded or removed or otherwise detached if connector 232 is pre-attached to MEIU 200 in the packaging.

In an embodiment, connector 232 comprises a washer connector that is coupled to MEIU 200 by insertion of a screw 233 through the washer. During installation of MEIU 200 on a panel 102 that does not comprise a neutral jaw, connector 232 is coupled to MEIU 200 by screw 233 and the neutral wire (not shown) that is coupled to connector 232 is connected by a technician to a neutral interface of panel 102 such as a socket. In this manner a neutral connection may be provided to MEIU 200.

In some embodiments, neutral blade 226 may be configured for removal, rotation or other manipulation where, for example, meter socket 108 does not have sufficient space to accept neutral blade 226 or neutral blade 226 would otherwise contact a live connection of some sort. As an example, neutral blade 226 may be removed, rotated to a flat position, or otherwise manipulated to support a variety of configurations for panel 102 while leader 228 is still connected to a neutral interface of MEIU 200 for use by MEIU 200 as needed. In some embodiments, MEIU 200 may also comprise a corresponding neutral jaw 234 (FIGS. 4 and 5) that is configured for receiving a corresponding neutral blade of a meter.

With reference to FIGS. 7-11, MEIU 200 comprises a removable fuse holder 236 that is slidingly removable relative to MEIU 200 via service hatch 218 when service hatch 218 is opened. Fuse holder 236 comprises fuses 238 that are electrically disposed between blades 214 and circuitry 240 of MEIU 200 and is configured to disconnect circuitry 240 of MEIU 200 from power supplied by panel 102 via jaws 112 and blades 214. In some embodiments, for example, the fuses 238 may be configured to burn out or otherwise react to disconnect circuitry 240 when there is an over-voltage event, over-current event or any other event from panel 102 in order to inhibit damage to circuitry 240 of MEIU 200. In all embodiments blades 214 provide power through to jaws 212.

Fuse holder 236 is configured for partial or complete removal from MEIU 200 via service hatch 218, e.g., by sliding or another mechanism. For example, with service hatch 218 opened, fuse holder 236 may be translated toward service hatch 218, e.g., in a linear, arcuate or other manner, such that a connection between blades 214 and circuitry 240 via fuses 238 is disconnected or interrupted. In some embodiments, fuse holder 236 may be completely removed from MEIU 200 via service hatch 218.

In this manner, circuitry 240 may be decoupled or de-energized from the power supplied by panel 102 such that a technician may work on components within MEIU 200 with little to no exposure to the high voltage power supply of panel 102. In addition, in some embodiments, the decoupling or de-energization of circuitry 240 may not inhibit the power supplied to structure 100. For example, while circuity 240 is decoupled or de-energized for maintenance or other purposes, the Electric Service Meter 110 may still receive power from panel 102, e.g., via the electrical coupling of jaws 112 of meter socket 108, blades 214 of MEIU 200, jaws 212 of MEIU 200 and blades 114 of meter cap 110. In this manner, the power supply to users of structure 100 is not interrupted by some maintenance activities that are performed on MEIU 200 while MEIU 200 is still coupled to meter socket 108 of panel 102.

With reference again to FIG. 10, a number of internal components of MEIU 200 are disposed below fuse holder 236, e.g., in a direction that blades 214 extend, and become accessible for service when fuse holder 236 is withdrawn or removed from MEIU 200 even when MEIU 200 is still coupled to panel 102. As an example, an external antenna connection 242 and an optical small form-factor pluggable (SFP) cage 244 of MEIU 200 may be exposed and accessible for maintenance or replacement when fuse holder 236 is withdrawn or removed from MEIU 200. The SFP technology is a standardized form factor used in IP networking equipment. SFP cage 244 holds an SFP or SFP+ device which provides optical or ethernet network connectivity and is accessible and replaceable in SFP case 244 when fuse holder 236 is removed.

With reference again to FIG. 11, a number of internal components of MEIU 200 are disposed above fuse holder 236, e.g., in a direction that jaws 212 extend, and become accessible for service when fuse holder 236 is withdrawn or removed from MEIU 200 even when MEIU 200 is still coupled to panel 102. As an example, a removable memory device 246 of MEIU 200 such as, e.g., a SD or flash card, may be exposed and accessible for maintenance or replacement when fuse holder 236 is withdrawn or removed from MEIU 200.

While various components are described and illustrated as being disposed above, below or adjacent to fuse holder 236, in other embodiments various components including one or more of external antenna connection 242, optical SFP case 244 and removable memory device 246 may be disposed in any other portion of MEIU 200 and exposed for service or maintenance by removal of fuse holder 236 or another component of MEIU 200.

Figure 12:
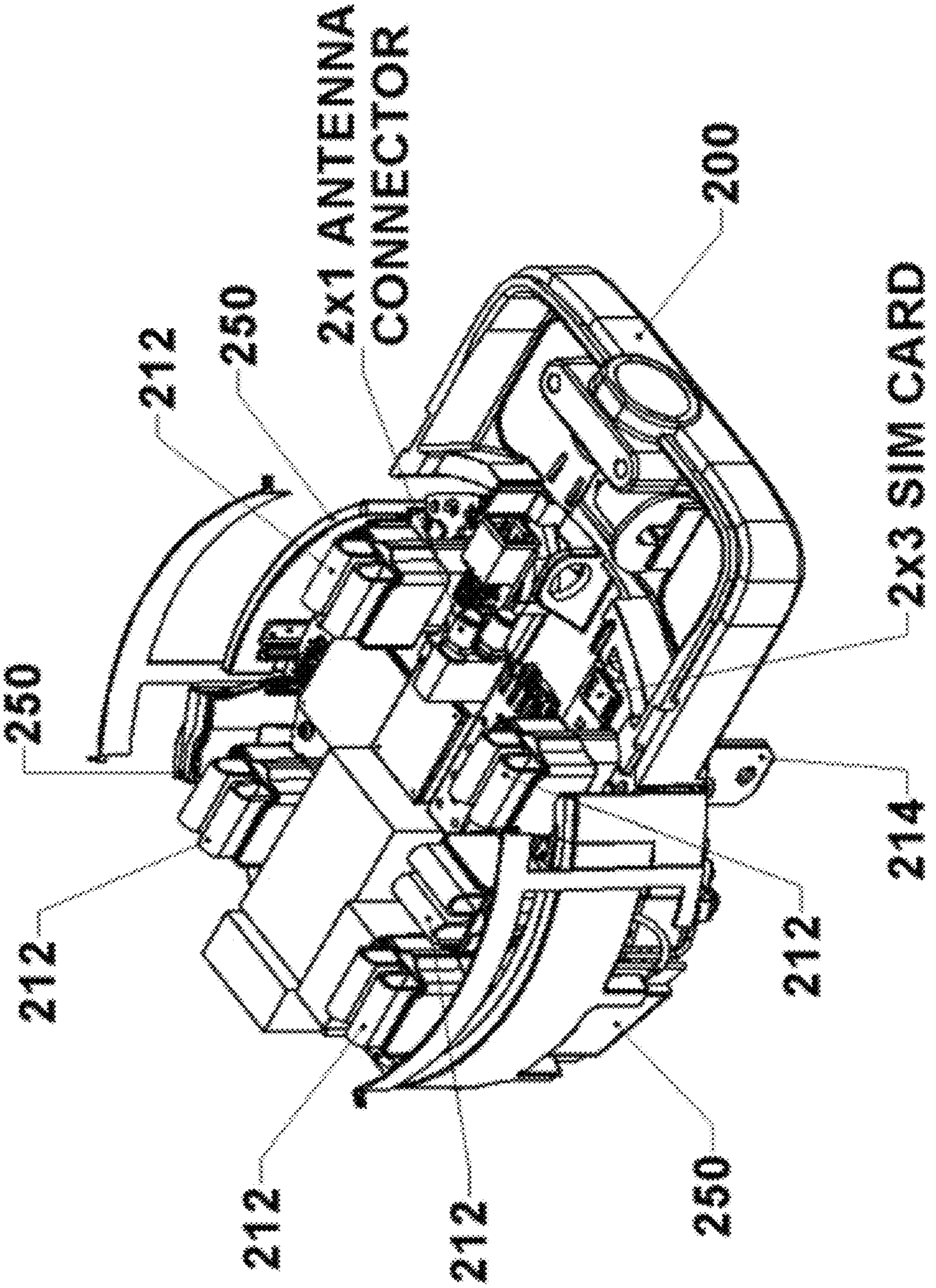
Figure 13:
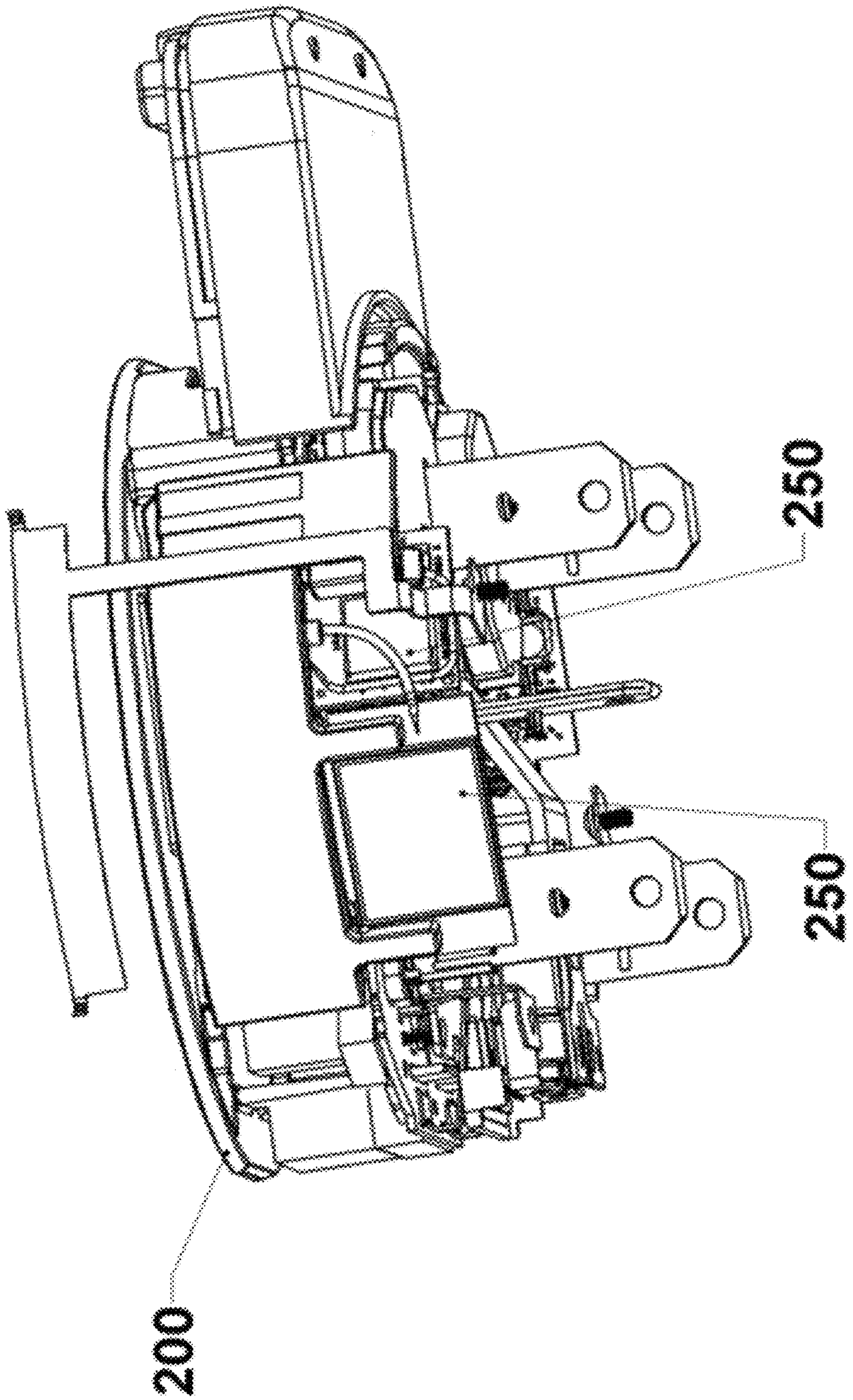
Figure 14:
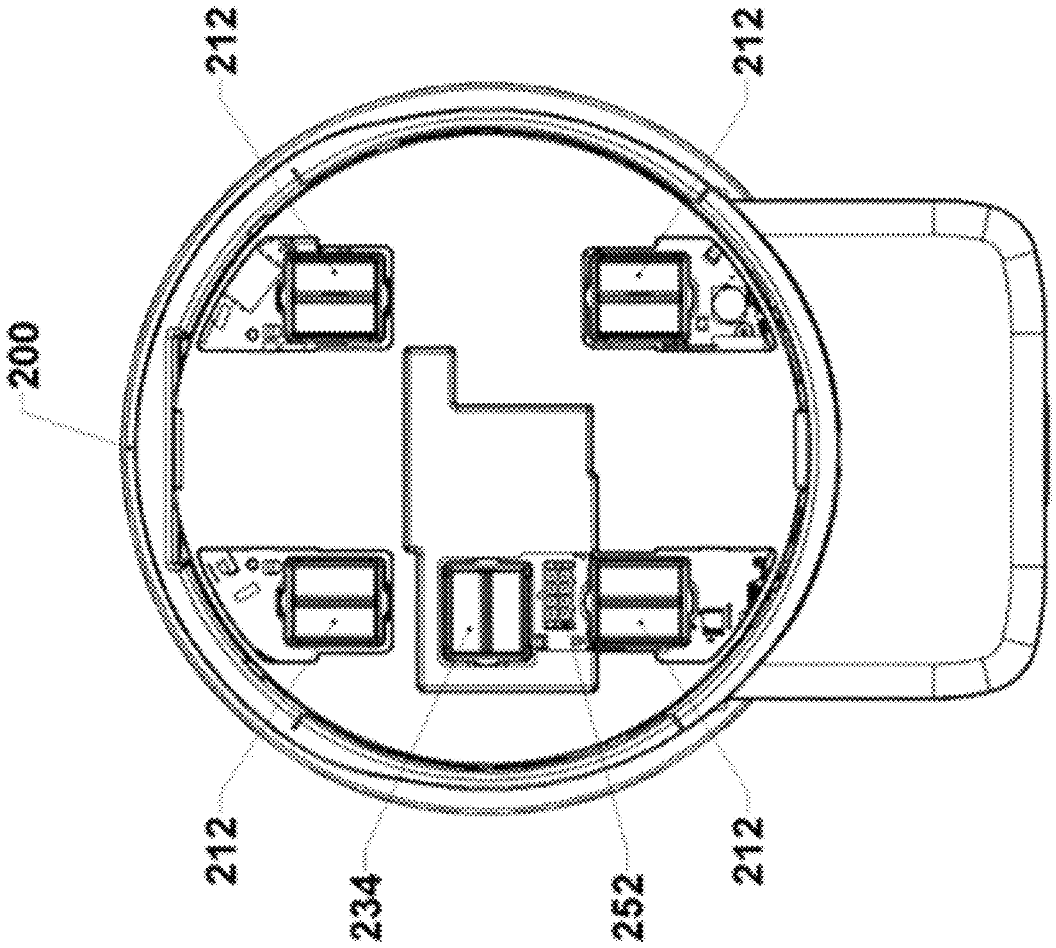
Figure 15:
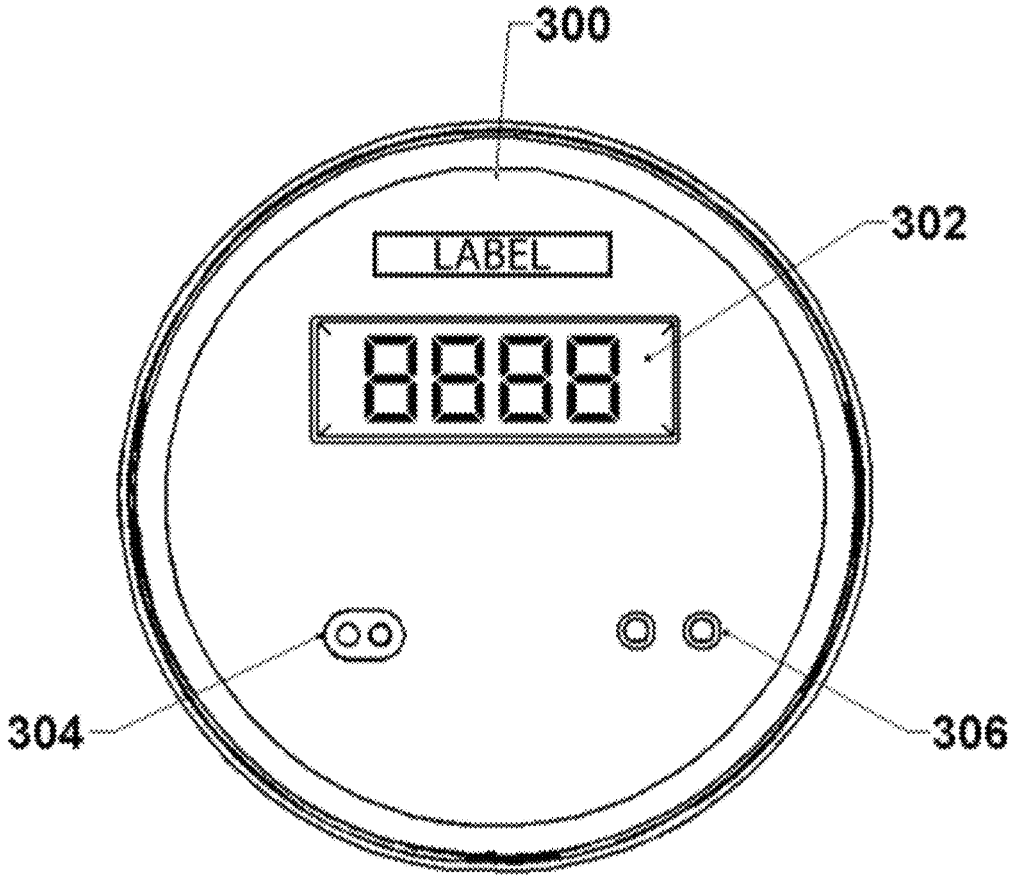
FIGS. 15-16 are top and bottom views of a meter cap in accordance with embodiments of the invention.
Figure 16:
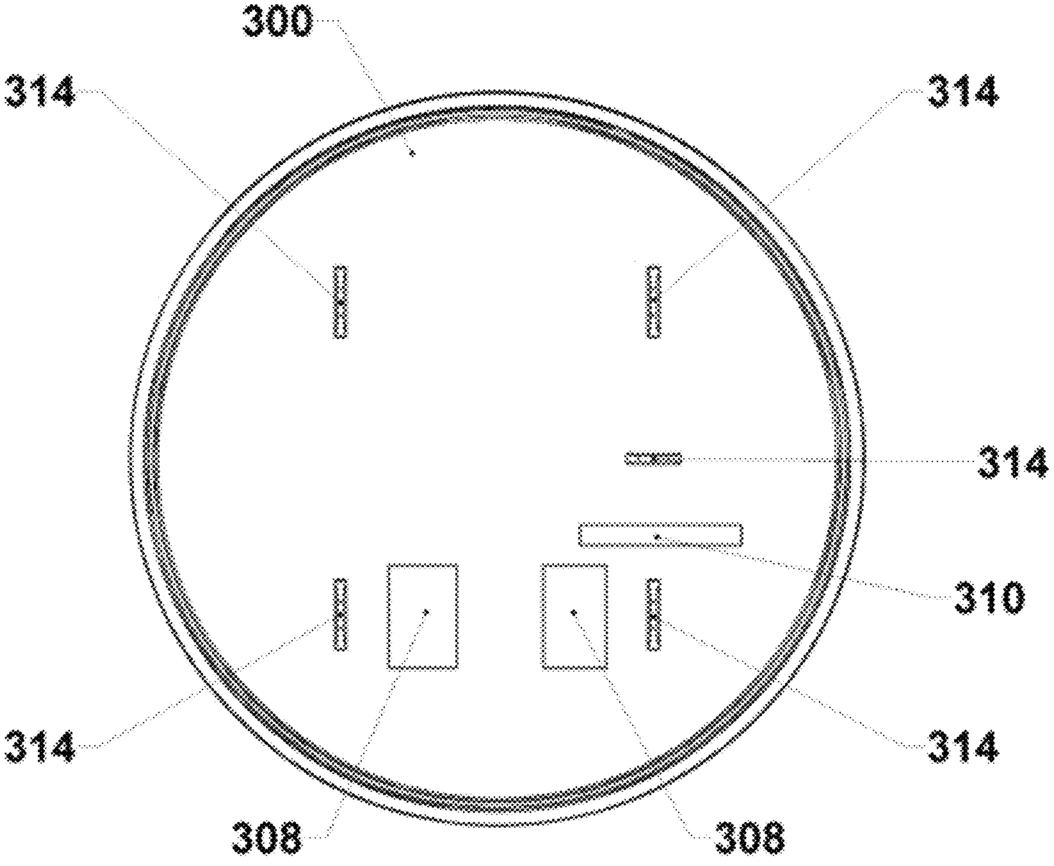

With reference to FIGS. 11-13, MEIU 200 comprises a modular configuration of components that are upgradable through the use of expansion cards. For example, MEIU 200 comprises expansion interface components 248 that are configured to couple to daughter boards 250 that are removable and upgradable as new technologies become available, new needs are identified or for any other reason. Example functionality that may be included in one or more of the daughter boards 250 may include wireless communication circuitry, processing circuitry, or any other circuitry that implements features and functionality of MEIU 200. As an example, daughter boards 250 may comprise circuitry that implements one or more wireless technologies including, e.g., Wi-Fi, Bluetooth, GPS, cellular, advanced metering infrastructure (AMI) Radio or any other wireless communication technology. Daughter boards 250 may include management circuitry that is configured to manage communications and control of various DERs located within and around the structure 100, e.g., manage communications and control of solar panels, EV chargers, EVs battery, backup systems, smart components or any other DERs. Daughter boards 250 may include processing and analytics circuitry that is configured to perform analytics on data, signals or other information obtained by MEIU 200, e.g., from DERs, from the power supply, from the meter, or from any other source. The processing and analytics circuitry may comprise machine learning or other artificial intelligence features.

When combined with an AMI daughter card, the MEIU 200 provides AMI network connectivity within the same device. The MEIU 200 provides an AMI network gateway feature through the AMI radio daughter card and the routing software (on the host processor). Normally the utility must locate the AMI RF network access gateway on a utility pole which can be costly to maintain. By enabling the AMI RF network gateway in the socket mounted device, the utility can more easily deploy and manage the AMI RF network and they get the combined functionality of the MEIU 200 and AMI network gateway in a single device.

Figure 19:
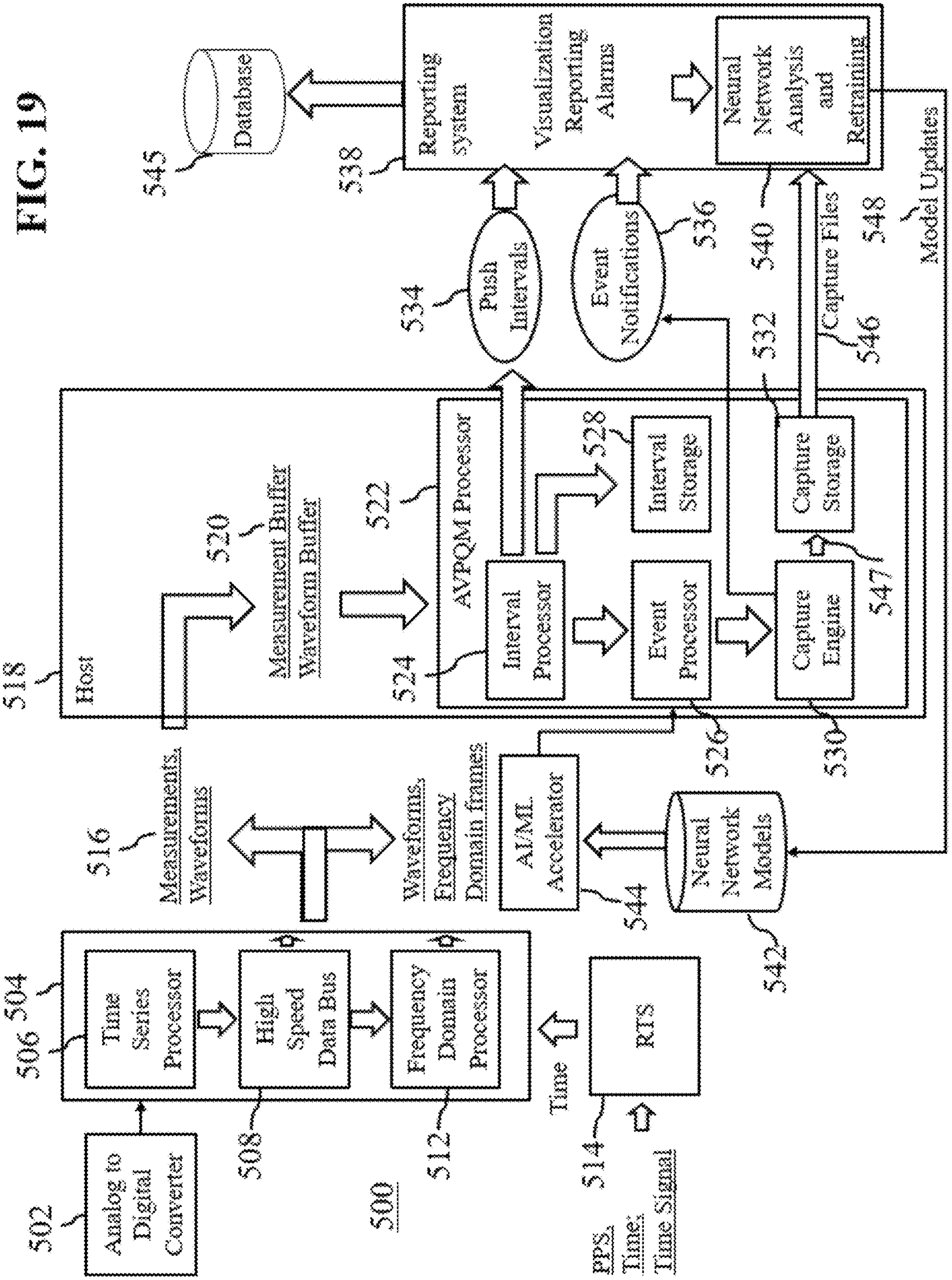
FIG. 19 is a block diagram of a system for measuring and reporting on power quality events in accordance with embodiments of the invention.

In another embodiment the MEIU 200 can be deployed where there is neither fiber, ethernet or cellular backhaul connectivity. In this case the AMI RF network daughter card is configured as a child device in the AMI network as opposed to a network gateway as described above. In this manner the MEIU 200 is able to establish communications with the reporting system 538 (FIG. 19). In this embodiment the network throughput is significantly lower than the other forms of communication provided and the MEIU 200 provides algorithms to optimize the use of network traffic. These algorithms are inherent in the design of the AVPQM processor 522 and the flexible Interval processor 524 and the event processor 526 which utilize the local storage 528, 532 and 547. In this manner it is still possible for the MEIU 200 to capture important power quality events and notify the reporting system even in a very low bandwidth communications environment.

With reference to FIGS. 14-17, in some embodiments, a standard Electric Service Meter 110 may be replaced with a Meter Cap 300 that may be configured for use with MEIU 200. In such embodiments, the Meter Cap 300 combined with the MEIU 200 perform the functions of the standard Electric Service Meter 110 in addition to the additional functionality described herein. Meter Cap 300 comprises a modular plug and play component system that is configured for enhanced serviceability by technicians in the field or the shop. As an example, meter cap 300 may comprise a display module 302, e.g., a liquid crystal display (LCD) or any other display, that may be installed on meter cap 300 and easily swapped out in a case where the LCD is damaged, exhibits failures over time or for any other reason. Similarly, meter cap 300 may comprise an optical interface module 304, buttons or other user interface modules 306 or any other modular components that may be easily replaced either in the field or in a service area, e.g., in a plug and play manner. In some embodiments, meter cap 300 may also comprise one or more fixed components that are not modular. In an embodiment, any component of meter cap 300 that may typically wear out in the field may be modularized to enable easy replacement in the field or in a service area and allow the functional life of MEIU 200 to be extended.

In another embodiment, Meter Cap 300 is configured with remote disconnect relays whose purpose is to enable the disconnection of power at the service location, commonly known as "Remote Disconnect". When actuated, these relays interrupt the power flowing between the blades 214A and 214B as well as between the blades 214C and 214D in this example. There are many possible meter forms that supply power to a service location with differing numbers of blades, this is an example of a four blade configuration. This example also includes a fifth blade providing the neutral connection for power. For example, meter cap 300 comprises one or more relays 308 that may be activated to disconnect power at the electric service location-this is commonly known as the "remote disconnect" capability provided inside of an Electric Service Meter. The relays 308 may also be modular and replaceable.

Meter Cap 300 also comprises blades 314 (FIG. 16) for engaging jaws 212 of MEIU 200 and a cable connection 310, e.g., a ribbon cable connection, that is configured to communicatively connect to a corresponding cable connection 252 of MEIU 200 to facilitate the transfer of data or other information between MEIU 200 and meter cap 300, e.g., by attachment of a ribbon cable (not shown) or any other connection. In some embodiments, a wireless connection may also or alternatively be established between MEIU 200 and meter cap 300 for the transfer of data.

Figure 17:
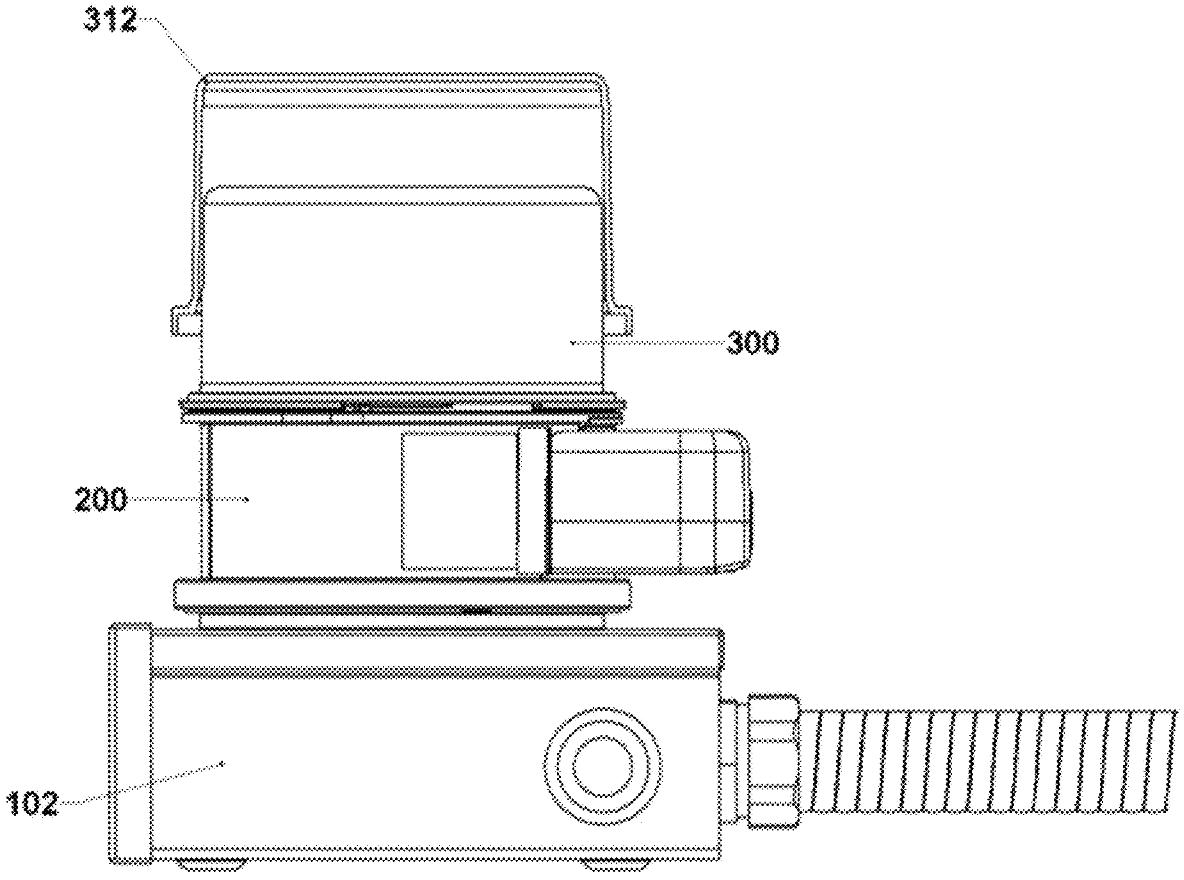
FIG. 17 is a side view of the MEIU assembled with the panel assembly, electric meter and meter cap in accordance with embodiments of the invention.

With reference to FIG. 17, to inhibit tampering, a cover 312 may be positioned over or integrated into meter cap 300, e.g., glass or another material, that inhibits removal of the modular components by unauthorized individuals. In some embodiments, for example, cover 312 may be attached to meter cap 300 and secured to meter cap 300, e.g., by a lock or another mechanism. In other embodiments, cover 312 may be positioned over meter cap 300 and secured to meter cap 300 or MEIU 200, e.g., by a tamper ring such as, e.g., tamper ring 120 or another tamper ring. For example, in some embodiments three tamper rings may be utilized where, for example, tamper ring 118 secures MEIU 200 to panel 102, tamper ring 118 secures meter cap 300 to MEIU 200 and a third tamper ring (not shown) secures cover 312 to meter cap 300 or MEIU 200.

The use of meter cap 300 with MEIU 200 may enable MEIU 200 and meter cap 300 to become a revenue grade meter that is sealed and certified. Service hatch 218 and fuse holder 236 together allow a sealed and certified revenue grade meter to still have some serviceability, e.g., for fuses and other components that are accessible when fuse holder 236 is removed, without breaking the seal and requiring a re-certification.

MEIU 200 is configured to provide utility DER communications and control functionality at the edge of the grid that is both secure and reliable. DERs such as solar panels and EV chargers or other DERs are often installed in or around a structure. Sometimes, such installations are performed without the knowledge of the utility, which may impact power delivery on the grid where, for example, one or more of the DERs attempts to push energy back onto the grid. If the supply and consumption for these DERs is not properly managed by the utility, the overall quality of the whole power delivery system may be degraded.

DER devices typically have the ability to communicate information and data back to a corresponding DER vendor's monitoring and control system. In some cases, some DERs may need to provide communications and control through a standard interface using an IP connection in order to function properly, e.g., through a physical ethernet connection or through a wireless connection. Typically, the owner of the structure connects the DERs to their personal network, e.g., using a modem, router, switch or other component. As an example, in a residence, the homeowner may simply connect the DER to their personal network which is often unreliable and depends on the owner's efforts to maintain the connection. In existing utility power supply systems, there is typically no reliable way to connect these DERs under utility management or on a utility managed network.

MEIU 200 comprises network functionality, e.g., integrated on circuitry 240 or one or more of daughter boards 250, that may be utilized to maintain and manage connectivity for multiple DERs, forward relevant data and communications to vendors of the DERs, and maintain control of the DERs with regard to power supply and consumption on the grid. Utility control of each communications path for a DER enables tight control of access to the communications network that improves security in the data associated with the functions of the DER that is not present, for example, on a homeowner's personal network.

By providing secure network connectivity to DERs such as solar panels and EV chargers, MEIU 200 is enabled to act as an intermediary and gain direct control of the power supply and consumption of the DERs from the control systems of the devices themselves. MEIU 200 also combines measurement, analytics, communications and control in a single device that is deployed at each grid edge point and structure 100. MEIU 200 also natively supports a flexible utility managed communications gateway for DERs that is configured to use multiple types of communication technologies and protocols for interfacing with a variety of different types of DERs including, e.g., wired technologies, fiber technologies, PLC technologies and wireless technologies. MEIU 200 is configured to support future technologies through the use of daughter boards 250 which may be installed in-factory for a specific end user environment having particular communication and processing needs. As the needs of the end user environment change or new technologies are implemented, one or more of daughter boards 250 may be swapped out or otherwise replaced to provide newly needed communication or processing functionality.

In addition to controlling some DERs, MEIU 200 is also configured to act as a network intermediary for the DERs, enabling connection between the DERs and their vendor's proprietary cloud service or other functionality if needed. This allows the owner of structure 100 to take full advantage of their DERs functionality and cloud services while the DER is still securely connected to the network of MEIU 200 and operating at least partially under the control of MEIU 200.

MEIU 200 also has an embedded control system that is configured to perform direct monitoring and control of any connected DERs in addition to routing communications traffic between the DER and a corresponding vendor service. The embedded control system enables MEIU 200 to function as part of a Supervisory Control and Data Acquisition system (SCADA), a Distributed Energy Resource Management System or both. Because MEIU 200 is configured to both provide intelligent automation and control of DERs at the edge of the grid and act as a communication intermediary between the DERs and their corresponding vendors in a single device, multiple devices do not have to be deployed at structure 100 to fulfill these functions. In addition, the utility can add both functionality and control features over time to MEIU 200, e.g., via software updates, without the need to add or replace hardware, or with minor hardware replacement such as, e.g., swapping out daughter boards 250.

With reference to FIG. 18, an example communication system 400 that may be implemented by MEIU 200 is illustrated. In communication system 400, MEIU 200 is positioned as an intermediary between a DER 402 and a corresponding DER vendor 404. MEIU 200 is also positioned as an intermediary between DER 402 and the utility SCADA 406. In some embodiments, for example, MEIU 200 provides an interface between the utility SCADA 406 and the DER 402 such that the utility interaction is simplified to just a protocol specific to communication with MEIU 200 while MEIU 200 handles any translation that may be needed to provide a corresponding communication or command to DER 402. For example, while there may be many types of DERs each having particular communication technologies and protocols, the utility SCADA 406 does not need to have any specific knowledge of how to communicate with the DERs directly. Instead, MEIU 200 handles all translation and conversion such that the same command received from utility SCADA 406 may be effectively applied to any of the DERs to give the utility SCADA 406 effective control of any type of DER without needing to know the particular details of the DER's communication protocols and communication technology.

In communication system 400, DER 402 is connected to an access point 408 of MEIU 200, e.g., in a wired or wireless manner, using one of the communication technologies or protocols described above. Access point 408 provides the communication to an ethernet switch 410 which routes the communication to an access control module 412. Access control module 412 is configured to determine a nature of the communication, e.g., whether the communication is related to a control signal or is providing data to DER vendor 404. If the communication is intended to provide data to DER vendor 404, access control module 412 provides the communication to routing module 414 with instructions to route the communication to DER vendor 404, e.g., via ethernet switch 410 or via Celluar Modem 418. This communication path is defined by the solid line arrows. The ethernet switch 410 is connected to a standard physical network interface 417 which can for example be a physical ethernet connection or a standard SFP socket allowing the communications path to be configurable between any supported SFP or SFP+type module (see FIG. 18) such as 1 GB and 10 GB Fiber or ethernet as required by the utility.

If the communication is related to a control signal, access control module 412 instructs routing module 414 to provide the communication to DER control module 416. DER control module 416 is configured to communicate with utility SCADA 406, shown as dashed and dotted lines, and also issue corresponding commands to DER 402, shown as dashed lines.

In some embodiments, the MEIU 200 includes an active software agent programmed to not only translate instructions but to also act as an independent agent able to determine what actions to take in response to certain measurements or events. The agent is programmed to determine on its own based on predefined rules and procedures what action to take, without needing a connection to SCADA or the DERMS. The agent's pre-configured set of programs are designed to execute on a schedule, in response to events, or some combination of both. The use of this agent allows for pushing at least some operations to the edge. The agent may be updated remotely by downloads from the SCADA, DERMS or other administrative system.

With reference to FIG. 19, MEIU 200 comprises an advanced power quality analytics sub-system 500 that is configured to detect events in the power system and alert the utility system operator about the events. Sub-system 500 receives input values, e.g., from an analog to digital converter 502. Sub-system 500 is configured to measure up to 12 individual power measurement channels which can be selected as measurement channels and as coincident capture channels. The data in these channels can represent measurements of the electrical potential, electrical current intensity, electrical signal frequency, real power, apparent power, reactive power, power factor, real power delivered, apparent power delivered, reactive power delivered, electrical resistance, electrical impedance, electrical reactance, total harmonic distortions of the electrical signal and total harmonic distortions of the electrical current intensity. An example chart of such measurement channels and their associated standard units of measure is illustrated in FIG. 20.

The values measured and converted to digital representation by 502 are fed into dedicated real-time processing devices 504 along with a time value produced by a Real Time Sync (RTS) component 514. Real-time processing devices 504 include, for example, a time series processor 506, a high speed data bus 508 and a frequency domain processor 512. An output of real-time processing devices 504, e.g., measurements and waveforms 516, are fed into a host device 518 such as, e.g., a linux host, and buffered in corresponding measurement and waveform buffers 520. The buffered data is processed by an AVPQM processor 522.

AVPQM processor 522 comprises an interval processor 524, interval storage 528, event processor 526, capture engine 530 and capture storage 532. Outputs from AVPQM processor 522 comprise push intervals 534 and event notifications 536 which are fed to a reporting system 538 which generates visualizations reporting and alarms. Reporting System 538 can retrieve waveform capture files 547 from Capture Storage 532 as required by the operator when it is determined that further analysis is required. This enables the system to store high resolution capture files at the edge 532 and only transmit them as required 546 thus saving both network bandwidth and storage space in the Reporting System 538. Reporting System has a database (545) of Event Notifications 536, Push Intervals 534 and Capture files 546 & 547. Reporting system 538 may also comprise a neural network analysis and retraining module 540 that utilizes the outputs of AVPQM processor 522 to generate model updates which are sent to a neural network models database 542. An artificial intelligence (AI)/machine learning (ML) accelerator 544 utilizes the models stored in neural network models database 542 to analyze waveforms and frequency domain frames that are output from real-time processing devices 504. The output of AI/ML accelerator 544 may also be provided to AVPQM processor 522 for use during the processing by interval processor 524, event processor 526 and capture engine 530. In another embodiment the AI/ML accelerator 544 will include the events 534 and intervals 536 generated by the AVPQM processor 522 to identify new complex events. This is especially useful when the events, waveforms and intervals are not all delivered to the reporting system 538 allowing complex analysis to occur on the edge device. This would not otherwise be possible unless all data was sent over the network to the reporting system 538.

In this manner, sub-system 500 allows a system operator to configure complex monitoring alarms and capture waveform files and coincident channel measurements on event detection. Sub-system 500 also may be configured for complex event detection using ML/AI accelerator. High precision measurement of events as a sub-millisecond resolution is driven by RTS component 514.

In some embodiments, sub-system 500 is optimized for a small footprint, resource constrained device and may be designed to minimize memory and computation resource usage when providing interval data, complex triggers, interval capture, coincident capture and waveform capture.

AVPQM processor 522 is configured to perform processing and calculations on data measurements received from real-time processing devices 504. In some embodiments, AVPQM processor 522 utilizes inputs from two Micro-Sequence Engines (MSEs). For example, one MSE (referred to as the AV12 MSE) is responsible for sampling the line 1 and line 2 electrical voltage and current signals from the multi-channel ADC at regular intervals, processing this data, and loading it into buffers to be read by the AVPQM application. The second MSE (referred to as the FFT MSE) is responsible for computing a Fast Fourier Transform on the data provided by the AV12 MSE and using the output to calculate Total Harmonic Distortion (THD).

In an embodiment, the AV12 MSE implements a sampling engine that comprises a sample timer. The AV12 MSE samples the four ADC inputs corresponding to the line 1 and line 2 electrical voltage and current at a rate of 122880 samples per second. The sample timing is based on the high resolution, drift-compensated clock provided by the RTS component 514. The RTS 514 is a high resolution, high accuracy real time clock that is connected directly to the real time processing devices 504 allowing high precision in time measurement of signals at the sub-second level. This is done to provide the most efficient and accurate design and does not rely on the less accurate clock of the host CPU in 518. Normally the clock in the host is set through the network from a network time server, but this information must be propagated to the underlying hardware, but the typical delay to transmit this information is typically measured in milliseconds, is higher than the required accuracy of microseconds required to accurately timestamp events such as transient voltage events that are measured in 504 down to 1/15,360th of a second or 65.1 microseconds. The precision of the time measurements is important in order to compare measurements from multiple devices within an electric distribution grid where the MEIU is installed on multiple service locations 100. The ability for the reporting system 538 to identify correlated events either through direct correlation of the events reported, or through the combination of process by the neural network analysis module 540 in the reporting system and the AIML accelerator 542 requires the time to be as accurate as possible. In one embodiment the RTS 514 obtains it's time synchronization from a satellite receiver such as GPS or Galileo. Along with the current location, GPS receivers provide current date and time along with a time pulse output whose rising edge provides up to 14 nS accuracy for time. The RTS 540 uses the time information along with the rising edge to synchronizes its clock. In another embodiment where GPS is not available, the host 518 utilizes the GMAC (Gigabit Ethernet Media Access Controller) 419 to synchronize using the Precision Time Protocol (PTP) standard IEEE 1588 which utilities commonly use in sub-station electrical networks for high speed synchronization. The MEIU can leverage this to gain high precision time when GPS is not available such as an indoor or highly blocked outdoor signal environment. In another embodiment where only low precision time is available, the MEIU utilizes the RTS to provide precision time measurements internally but they are not synchronized to a high precision time source such as GPS or PTP. In this embodiment measurements made by a single MEIU still have precision measurements which can be compared with other measurements made by the same device and do not prevent the use of analytics in the reporting system 538.

The clock of RTS component 514 has a resolution of 200 MHz. Dividing this clock rate by the sample rate gives a sample period of approximately 1627.6041667. Since samples are not timed to a non-integer interval, the AV12 MSE is configured to modulate the sample period such that the average sample period over any given interval is as close as possible to the correct period in order to minimize jitter. Dividing the clock rate and sampling rate by their greatest common denominator provides a ratio of 78125:48 which can be used on an iterative algorithm to determine that 1627*19+1628*29=78125.

In order to determine an optimal interval for each sample, an arbitrary threshold value that is >29 may be selected and an accumulator is initiated to the threshold value. Then, for each sample, if the accumulator is below the threshold value, the next sample period is set to 1628 and 19 is added to the accumulator. If the accumulator is above or equal to the threshold value, the next sample period is set to 1627 and 29 is subtracted from the accumulator.

Once the period for the next sample rate has been calculated, it can be added to the last sample time to get the next sample time. This process may be performed by a loop comprising reading the RTS real-time register and calculating the remaining time. This process of reading the RTS time, subtracting the last sample time, comparing the result to the threshold value and writing to the RTS unlock register may take multiple cycles. In order to keep the sample timing as accurate as possible, once the remaining time drops below a certain threshold, the AV12 MSE programs the remaining cycles into a counter for an instruction with the delay bit set. AVPQM processor 522 may then spin on this instruction very quickly and jump to the ADC read as soon as it's counter reaches zero. The ADC may be programmed in single-scan mode. This means that after triggering the ADC all four selected channels are converted automatically in sequence. The conversion of all four channels takes ~375 cycles. In order to avoid idle time, when the sample timer returns, the AV12 MSE reads the previous sample value from the ADC output registers and then triggers the next conversion.

In some embodiments, the ADC produces unsigned 12 bit values. To convert these to the required signed values, the values may be padded out to 32 bits and then the calibrated midpoint (approximately 0×800) is subtracted, which results in the MSE producing a 32 bit two's complement signed value that may be utilized for further processing. This calibrated ADC offset value may need to be supplied by the host after loading the MSE but before starting it.

To maximize the ADC resolution, an input amplifier may dynamically scale its gain based on the signal amplitude. When the input level is within a certain range, the gain will be multiplied by a corresponding factor. This gain level will be indicated to the AV12 MSE by the state of two GPIO pins. When the AV12 MSE detects that the input is at a particular gain setting, the value read from the ADC will be scaled up by the complementary factor, such that the original signal is correctly reconstructed. In some cases, care may need to be taken around the transition point, since the gain change cannot be instantaneous and the ADC and indicator pin cannot be read simultaneously. Therefore, when a change is detected in the gain state, the accompanying sample for that channel may be discarded and replaced with a sample extrapolated from the previous values.

In some cases, both the received voltage and current signals should, by definition, contain no DC component. Therefore, any residual DC offset remaining at this point may be assumed to be an error in the analog amplifier or ADC. This residual DC offset may be removed, for example, by a high-pass filter.

The electrical current channels represent the output of a Rogowski Coil, a sensor whose output voltage is proportional to the derivative of the electrical current passing through the Rogowski Coil. In order to determine a true instantaneous current, the current channel signals are integrated.

The resolution of the input signals, after dynamic scaling, may be insufficient to meet a target accuracy requirement at low amplitudes. The high sampling rate relative to a final delivered sample rate may be taken advantage of, e.g., a sampling rate that is 8× the final delivered sample rate, to increase resolution in the frequency band that is being measured, while simultaneously providing anti-aliasing filtering for the later resampling stage. This may be accomplished by summing over a moving window of 8 samples to produce a new sample stream with an additional 3 bits of resolution. For the current channel, a recursive implementation of a true moving sum is used. A delay line stores the previous 8 samples. Each new sample is added to a running sum and the oldest sample is subtracted. This sum becomes the output stream.

Integration and resampling to the final output rate of 256 samples/cycle are accomplished in the same step. 8 samples are summed together to produce one new input sample. This result is multiplied by a 32-bit fixed-point coefficient, which has been calculated to produce a 32 bit full scale value with unity gain at 60 Hz. The result is then added to the previous output ($z^{-1}$) value. The precise value of this coefficient is adjusted based on calibration measurements and is provided by the host after loading the MSE but before starting it. A small derivative term is added by multiplying the previous output ($z^{-2}$) by a very small coefficient and subtracting to produce the new output value. This bleeds off any residual DC from the internal accumulated value.

For the voltage channels, a moving sum filter provides anti-aliasing filtering while increasing the effective resolution of the output in the pass-band. A simple accumulator sums every 8 samples to produce an output sample stream of 256 samples per cycle, so that filtering and decimation are accomplished efficiently in a single step.

To measure the frequency and relative phase of the AV12 channels a zero-crossing detector may be implemented for all four channels, which compares the previous and current samples and looks for a crossing from negative to positive. A sample counter which is reset on each crossing is used to measure the period which is then used to compute the frequency for V1, and the relative phase for V2, A1 and A2. Since the expected frequency is within a narrow range, e.g., around 60 Hz, a minimum sample count may be utilized before allowing a new zero-crossing to be detected in order to prevent false triggers. Zero-crossing detection is performed at the output sample rate, after filtering and resampling. Linear interpolation is used to further refine the zero-crossing measurement to sub-sample accuracy. The zero-crossing of V1 is used to reset high and low watermarks for each channel. On a new zero-crossing these marks are stored as the most recent minimum and maximum peak values, to be delivered with other per-cycle data on every interrupt.

The AV12 MSE is also responsible for computing the sum of squares for all four channels, which is used by the host to calculate the true RMS for each channel. The MSE also computes a sum of Watts (Volts x Amps), or instantaneous power, which is used by the host to calculate the average power and the total energy received/delivered. The RMS and Watts values are computed at the output sample rate of 256 samples/cycle. For every output sample, and every channel, the square is calculated. To avoid the sum overflowing it's 64 bit container, this square value is then right shifted 8 bits before adding it to an accumulator. For lines 1 and 2, Watts are calculated and added to two separate accumulators, one for Watts Average, and one for Watts Sum. On each zero-crossing of V1, the accumulated values for RMS and Watts Average are stored, along with the number of samples counted since the previous zero-crossing. Then the accumulators are reset. On the last sample of each buffer, the accumulated values for Watts Sum are stored and the accumulators reset. The stored values for RMS, Watts Average Watts Sum and the sample count are then delivered as part of the AV12 Metadata.

The AVPQM alarm configuration may be set for a variety of parameters and alarms. The parameters for an example alarm condition for a loose neutral is illustrated in FIG. 21. The parameters for an example alarm condition for possible detection of EV or BES is illustrated in FIG. 22. The parameters for an example alarm condition for unexpected received energy is illustrated in FIG. 23. The parameters for an example alarm condition for fast voltage transients, e.g., where a duration is as short as 1/256th of a cycle, is illustrated in FIG. 24.

In some embodiments, alarms for temperature may also be utilized where, for example, a high temperature alarm may be generated if the internal temperature exceeds a prescribed temperature for a prescribed period of time. Temperature can be configured just like any AVPQM channel for delivery to the utility SCADA, storage or user-configurable alarming.

FIGS. 1 through 26 are conceptual illustrations allowing for an explanation of the disclosed embodiments of the invention. Notably, the figures and examples above are not meant to limit the scope of the invention to a single embodiment, as other embodiments are possible by way of interchange of some or all of the described or illustrated elements. Moreover, where certain elements of the disclosed embodiments can be partially or fully implemented using known components, only those portions of such known components that are necessary for an understanding of the disclosed embodiments are described, and detailed descriptions of other portions of such known components are omitted so as not to obscure the disclosed embodiments. In the present specification, an embodiment showing a singular component should not necessarily be limited to other embodiments including a plurality of the same component, and vice-versa, unless explicitly stated otherwise herein. Moreover, terms in the specification or claims are not intended to be ascribed an uncommon or special meaning unless explicitly set forth as such. Further, the disclosed embodiments encompass present and future known equivalents to the known components referred to herein by way of illustration.

It should be understood that the various aspects of the embodiments could be implemented in hardware, firmware, software, or combinations thereof. In such embodiments, the various components and/or steps would be implemented in hardware, firmware, and/or software to perform the functions of the disclosed embodiments. That is, the same piece or different pieces of hardware, firmware, or module of software could perform one or more of the illustrated blocks (e.g., components or steps). In software implementations, computer software (e.g., programs or other instructions) and/or data is stored on a machine-readable medium as part of a computer program product and is loaded into a computer system or other device or machine via a removable storage drive, hard drive, or communications interface. Computer programs (also called computer control logic or computer-readable program code) are stored in a main and/or secondary memory, and executed by one or more processors (controllers, or the like) to cause the one or more processors to perform the functions of the invention as described herein. In this document, the terms "machine readable medium," "computer-readable medium," "computer program medium," and "computer usable medium" are used to generally refer to media such as a random access memory (RAM); a read only memory (ROM); a removable storage unit (e.g., a magnetic or optical disc, flash memory device, or the like); a hard disk; or the like.

The foregoing description will so fully reveal the general nature of the disclosed embodiments that others can, by applying knowledge within the skill of the relevant art(s) (including the contents of the documents cited and incorporated by reference herein), readily modify and/or adapt for various applications such specific embodiments, without undue experimentation, without departing from the general concept of the disclosed embodiments. Such adaptations and modifications are therefore intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one skilled in the relevant art(s).

What is claimed is:

1. A system for measuring power quality at a structure receiving electrical power from a utility, the system comprising:

a monitoring unit configured to be electrically coupled to a panel assembly of the structure and to an electric service meter; and a measurement unit coupled to the monitoring unit and configured to measure a plurality of electrical values associated with the panel assembly, detect power quality events based on the measured electrical values, transmit the detected power quality events to a remote reporting system, produce refined power measurements of electrical values based on a measurement reconfiguration received from the remote reporting system, and transmit data representing the refined power measurements to the remote reporting system.

2. The system of claim 1, wherein the monitoring unit comprises an expansion interface component configured to couple to a modular daughter board programmed to extend a functionality of the measurement unit.

3. The system of claim 1, wherein the monitoring unit comprises a plurality of blades configured for insertion into a plurality of jaws of the panel assembly to electrically couple the monitoring unit to the panel assembly, and wherein the measurement unit is connected to the blades.

4. The system of claim 1, wherein the measurement unit is configured to detect events that are detectable at a specific location in an electric grid to allow the reporting system to aggregate a plurality of such events received from different monitoring units to coordinate a grid wide view of distribution events.

5. The system of claim 1 wherein the measurement unit is configured to generate power measurement waveforms based on the measured electrical values and comprises a pattern recognition system to detect events in the power measurement waveforms.

6. The system of claim 1 wherein the power quality events include high speed voltage transients.

7. The system of claim 1, wherein the measurement unit is configured to detect events based on a logical combination of individual events from the electrical power measurements measured by the measurement unit.

8. The system of claim 1, wherein the measurement unit is configured to capture data from any combination of power measurement channels when an event is detected allowing the recording of measurements that are coincident with the detected event.

9. A system for measuring power quality on an electrical grid, the system comprising:

a plurality of monitoring systems installed at a plurality of edge structures receiving power via the electrical grid, each edge structure having its own electric service meter configured to measure power usage from the electrical grid by resources at such edge structure, each monitoring system configured to be electrically coupled to a panel assembly of the structure at which it is installed and to an electric service meter at such structure, each monitoring system comprising a measurement unit configured to measure a plurality of electrical values associated with the panel assembly at the structure and to detect power quality events based on the measured electrical values; and a reporting system communicatively coupled to the plurality of monitoring systems and configured to receive data representing the detected power quality events from the monitoring systems and detect patterns of disruption within the electrical grid through pattern matching of detected power quality events received from the plurality of monitoring systems.

10. The system of claim 9, wherein the reporting system is configured to allow a user to reconfigure one or more of the monitoring systems to further refine power measurements.

11. The system of claim 10, wherein the reporting system is configured to receive refined power measurements from the one or more monitoring systems and triangulate a source of a disturbance in the electrical grid based on the refined power measurements.

12. The system of claim 9, wherein the pattern matching is detected through a neural network, machine learning model, or statistical model.

13. The system of claim 9, wherein the reporting system downloads data captured by the monitoring systems associated with the detected power quality events.

14. The system of claim 13, wherein the reporting system comprises a user interface module to enable an operator to select events and files to download from a monitoring system.

15. The system of claim 13, wherein the reporting system automatically selects data to download from the monitoring systems.

16. The system of claim 13, wherein the reporting system is configured to analyze the received power quality events and associated downloaded data to identify a probability of a complex event and to report this data to a user.

17. A system for monitoring and controlling power usage at a structure, the structure comprising an electrical panel assembly and including one or more distributed energy resources, the system comprising:

a modular energy intelligence unit (MEIU) configured for electrical coupling to the panel assembly and to an electric service meter such that the MEIU may be electrically disposed between the panel assembly and the electric service meter;

a measurement unit coupled to the MEIU and configured to measure a plurality of electrical values associated with the panel assembly or the structure, detect power quality events based on the measured electrical values, transmit the detected power quality events to a remote reporting system, produce refined power measurements of electrical values based on a measurement reconfiguration received from the remote reporting system, and transmit data representing the refined power measurements to the remote reporting system.

18. The system of claim 17, wherein the measurement unit is configured to generate power measurement waveforms based on the measured electrical values and comprises a pattern recognition system to detect events in the power measurement waveforms.

19. The system of claim 17 wherein the power quality events include high speed voltage transients.

20. The system of claim 17, wherein the measurement unit is configured to detect events based on a logical combination of individual events from the electrical power measurements measured by the measurement unit.

* * * * *